(12) United States Patent
Takahashi

(10) Patent No.: US 10,796,983 B2
(45) Date of Patent: *Oct. 6, 2020

(54) POSITIONAL RELATIONSHIP AMONG COMPONENTS OF SEMICONDUCTOR DEVICE

(71) Applicant: RENESAS ELECTRONICS CORPORATION, Tokyo (JP)

(72) Inventor: Noriyuki Takahashi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/577,596

(22) Filed: Sep. 20, 2019

(65) Prior Publication Data
US 2020/0013702 A1 Jan. 9, 2020

Related U.S. Application Data

(63) Continuation of application No. 16/019,301, filed on Jun. 26, 2018, now Pat. No. 10,461,020, which is a
(Continued)

(30) Foreign Application Priority Data

Mar. 13, 2014 (JP) .................................. 2014-050460

(51) Int. Cl.
*H01L 23/495* (2006.01)
*H01L 23/48* (2006.01)
(Continued)

(52) U.S. Cl.
CPC ...... *H01L 23/49541* (2013.01); *H01L 23/293* (2013.01); *H01L 23/3107* (2013.01);
(Continued)

(58) Field of Classification Search
CPC ............... H01L 23/293; H01L 23/3107; H01L 23/49503; H01L 23/4952; H01L 23/49555;
(Continued)

(56) References Cited

U.S. PATENT DOCUMENTS 4,920,074 A 4/1990 Shimizu et al.
5,041,901 A 8/1991 Kitano et al.
(Continued)

FOREIGN PATENT DOCUMENTS

JP H02-083961 A 3/1990
JP H04-094747 U 8/1992
(Continued)

OTHER PUBLICATIONS

Office Action issued in corresponding Japanese Patent Application No. 2014-050460, dated Aug. 1, 2017.
(Continued)

*Primary Examiner* — Kimberly N Rizkallah
*Assistant Examiner* — Dilinh P Nguyen
(74) *Attorney, Agent, or Firm* — McDermott Will & Emery LLP

(57) ABSTRACT

A QFP has a die pad on which a semiconductor chip is mounted, a plurality of inner parts disposed around the die pad, a plurality of outer parts respectively connected with the plurality of inner parts, a plurality of wires electrically connect the bonding pads of the semiconductor chip and the plurality of inner parts, and a sealing body that seals the semiconductor chip. Moreover, the thickness of the semiconductor chip is larger than a thickness from a lower surface of the die pad to a lower surface of the sealing body, and a distance from the lower surface of the sealing body to a tip portion of each of the plurality of outer parts is larger than a thickness of the sealing body from a main surface of
(Continued)

the semiconductor chip to an upper surface of the sealing body.

6 Claims, 25 Drawing Sheets

Related U.S. Application Data continuation of application No. 14/593,689, filed on Jan. 9, 2015, now Pat. No. 10,032,700.

(51) Int. Cl.
| | |
|---|---|
| *H01L 23/52* | (2006.01) |
| *H01L 23/31* | (2006.01) |
| *H01L 23/544* | (2006.01) |
| *H01L 23/29* | (2006.01) |
| *H01L 23/00* | (2006.01) |
| *H01L 21/48* | (2006.01) |

(52) U.S. Cl.
CPC .... *H01L 23/4952* (2013.01); *H01L 23/49503* (2013.01); *H01L 23/49555* (2013.01); *H01L 23/544* (2013.01); *H01L 21/4842* (2013.01); *H01L 23/49565* (2013.01); *H01L 23/49582* (2013.01); *H01L 24/29* (2013.01); *H01L 24/45* (2013.01); *H01L 24/48* (2013.01); *H01L 24/49* (2013.01); *H01L 24/73* (2013.01); *H01L 2223/54406* (2013.01); *H01L 2223/54433* (2013.01); *H01L 2223/54486* (2013.01); *H01L 2224/05553* (2013.01); *H01L 2224/05599* (2013.01); *H01L 2224/29339* (2013.01); *H01L 2224/32245* (2013.01); *H01L 2224/45144* (2013.01); *H01L 2224/45147* (2013.01); *H01L 2224/48091* (2013.01); *H01L 2224/48247* (2013.01); *H01L 2224/48465* (2013.01); *H01L 2224/49171* (2013.01); *H01L 2224/73265* (2013.01); *H01L 2224/92247* (2013.01); *H01L 2924/00012* (2013.01); *H01L 2924/00014* (2013.01); *H01L 2924/0665* (2013.01); *H01L 2924/10162* (2013.01); *H01L 2924/10253* (2013.01); *H01L 2924/12042* (2013.01); *H01L 2924/15747* (2013.01); *H01L 2924/181* (2013.01); *H01L 2924/1815* (2013.01); *H01L 2924/351* (2013.01)

(58) Field of Classification Search
CPC ............ H01L 23/544; H01L 23/49541; H01L 23/49582; H01L 23/49565; H01L 24/29; H01L 24/48; H01L 24/45; H01L 24/73; H01L 21/4842; H01L 2924/10253; H01L 2924/15747; H01L 2924/00014; H01L 2924/181; H01L 2924/1815; H01L 2924/351; H01L 2224/48091; H01L 2224/45147; H01L 2224/45144; H01L 2224/32245; H01L 2224/29339; H01L 2224/92247; H01L 2224/05553; H01L 2224/48465; H01L 2224/49171; H01L 2224/73265; H01L 2223/54433; H01L 2223/54406; H01L 2223/54486

USPC ................ 257/676, 672, 685, 786, 787, 784
See application file for complete search history.

(56) References Cited

U.S. PATENT DOCUMENTS

| | | |
|---|---|---|
| 5,055,912 A | 10/1991 | Murasawa et al. |
| 5,841,190 A | 11/1998 | Noda et al. |
| 6,028,364 A | 2/2000 | Ogino et al. |
| 10,032,700 B2 | 7/2018 | Takahashi |
| 2004/0056363 A1 | 3/2004 | Wada et al. |
| 2009/0102029 A1* | 4/2009 | Tadaoka ............ H01L 23/49524 257/673 |
| 2010/0006995 A1* | 1/2010 | Kasuya ............. H01L 23/49503 257/676 |
| 2012/0120613 A1* | 5/2012 | Kuwabara ............. H01L 21/561 361/746 |
| 2013/0308278 A1 | 11/2013 | Matsumoto |
| 2014/0087614 A1 | 3/2014 | Matsuda et al. |
| 2014/0225239 A1 | 8/2014 | Kimura |
| 2015/0194376 A1 | 7/2015 | Shimobe et al. |
| 2015/0262922 A1 | 9/2015 | Takahashi |
| 2018/0315686 A1 | 11/2018 | Takahashi |

FOREIGN PATENT DOCUMENTS

| | | |
|---|---|---|
| JP | H04-320359 A | 11/1992 |
| JP | 5-3277 A | 1/1993 |
| JP | H05-090473 A | 4/1993 |
| JP | 5-175406 A | 7/1993 |
| JP | 07-263610 A | 10/1995 |
| JP | 2004-228259 A | 8/2004 |
| JP | 2004-319954 A | 11/2004 |
| JP | 2012-084795 A | 4/2012 |
| JP | 2014-30049 A | 2/2014 |
| JP | 2015-176907 A | 10/2015 |

OTHER PUBLICATIONS

Chinese Office Action issued in corresponding Chinese Patent Application No. 201410658551.7, dated May 5, 2019, with English Translation.
Japanese Office Action issued in corresponding Japanese Patent Application No. 2018-088371, dated May 28, 2019, with English Translation.
Office Action issued in corresponding Taiwan Patent Application No. 103139425, dated Jan. 3, 2018.
U.S. PTO Non-Final Office Action issued in related parent U.S. Appl. No. 16/019,301, dated Apr. 5, 2019.
U.S. PTO Notice of Allowance issued in related parent U.S. Appl. No. 16/019,301, dated Jun. 26, 2019.
Related U.S. Appl. No. 16/019,301, filed Jun. 26, 2018 and U.S. Appl. No. 14/593,689, filed Jan. 9, 2015.
Chinese Office Action issued in corresponding Chinese Patent Application No. 201410658551.7, dated Dec. 20, 2018, with English Translation.
Japanese Office Action issued in corresponding Japanese Patent Application No. 2018-088371, dated Jan. 8, 2019, with English Translation.
Extended European Search Report EP Application No. 14194103.9 dated Oct. 28, 2015.
Japanese Decision of Refusal dated Feb. 6, 2018 issued in Japanese Patent Application No. 2014-050460 (with English translation).

* cited by examiner

FIG. 16
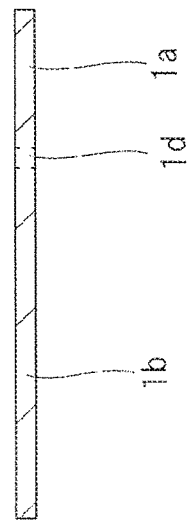
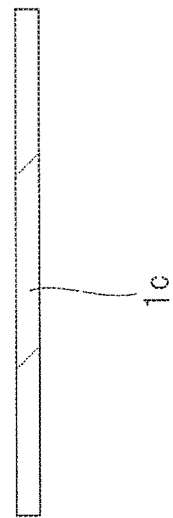
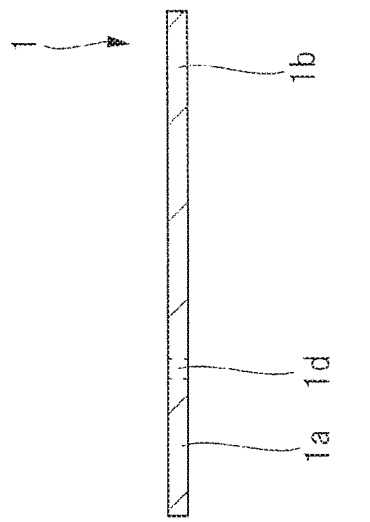

POSITIONAL RELATIONSHIP AMONG COMPONENTS OF SEMICONDUCTOR DEVICE

CROSS-REFERENCE TO RELATED APPLICATIONS

The present application is a Continuation of U.S. patent application Ser. No. 16/019,301, filed on Jun. 26, 2018, which is a Continuation of U.S. patent application Ser. No. 14/593,689, filed on Jan. 9, 2015, which claims priority from Japanese Patent Application No. 2014-050460, filed on Mar. 13, 2014, the entire contents of each are incorporated herein by reference.

TECHNICAL FIELD OF THE INVENTION

The present invention relates to a semiconductor device, for example, a technique effectively applied to a semiconductor device including a plurality of leads protruding from side surfaces of a sealing body which seals a semiconductor chip.

BACKGROUND OF THE INVENTION

As an example of a semiconductor device provided with a sealing body (package), Japanese Patent Application Laid-Open Publication No. 2004-319954 (Patent Document 1) discloses a structure in which a plurality of leads protrude outward from side surfaces of a package.

Moreover, for example, Japanese Patent Application Laid-Open Publication No. 5-3277 (Patent Document 2) discloses a structure of a semiconductor device having a plurality of gull-wing outer leads.

SUMMARY OF THE INVENTION

When a thermal expansion coefficient of a semiconductor device (semiconductor package) to be mounted on a motherboard (wiring board) is different from that of the motherboard, a joint failure is likely to occur at a joint portion between the motherboard and the semiconductor device mounted on the motherboard. The cause of the occurrence of this joint failure lies in that, when the motherboard having the semiconductor device mounted thereon is deformed (expanded, contracted) due to heat, the amount of deformation (amount of expansion, amount of contraction) of the motherboard differs from the amount of deformation (amount of expansion, amount of contraction) of the semiconductor device that is similarly deformed (expanded, contracted) due to heat.

On the other hand, for example, in the case of a QFP (Quad Flat Package), one part (outer part) of each of leads serving as external terminals of a semiconductor device is bent on the outside of the sealing body that seals a semiconductor chip. More specifically, one part (outer part) of each of the leads to be bonded to the motherboard is not secured by the sealing body.

Therefore, for example, as shown by a comparative example of FIG. 31, even when the motherboard 12 is greatly contracted (in a direction S) in comparison with the semiconductor device (QFP 21), since one part (outer part) of each lead 21a is allowed to follow the variation of the motherboard 12, the joint failure is unlikely to occur.

However, in recent years, the semiconductor devices tend to be used under an even more severe environment in comparison with the conventional products (for example, in-vehicle products).

Therefore, the inventor of the present invention has studied about a structure of a semiconductor device capable of ensuring higher mounting reliability (mounting strength) than that of the conventional QFPs.

Other problems and novel characteristics of the present invention will be apparent from the description of the specification and the accompanying drawings.

A semiconductor device according to one embodiment includes a die pad, a semiconductor chip, a plurality of leads and a sealing body that seals the semiconductor chip, and a thickness of the semiconductor chip is larger than a thickness from a second surface of the die pad to a lower surface of the sealing body. Moreover, a distance from the lower surface of the sealing body to a tip portion in one part of each of the plurality of leads is larger than a thickness of the sealing body from a main surface of the semiconductor chip to an upper surface of the sealing body.

According to the above-mentioned embodiment, it is possible to enhance the mounting reliability of the semiconductor device.

BRIEF DESCRIPTIONS OF THE DRAWINGS

FIG. 16 is a cross-sectional view showing one example of a cross-sectional structure taken along a line A-A of FIG. 15;

DESCRIPTIONS OF THE PREFERRED EMBODIMENT

Figure 1:
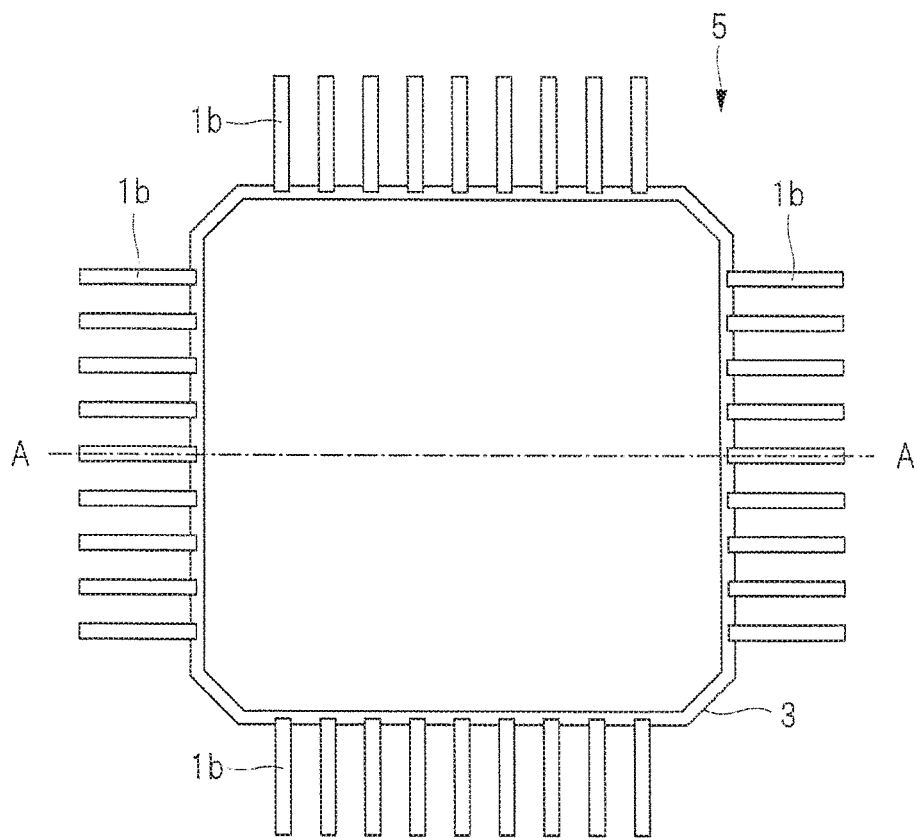
FIG. 1 is a plan view showing one example of a structure of a semiconductor device (QFP) according to an embodiment.

In the embodiments described below, the description of the same or similar portions is not repeated in principle unless particularly required.

Further, in the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle.

Also, even when mentioning that constituent elements or the like are "made of A", "made up of A", "have A" or "include A" in the embodiments below, elements other than A are of course not excluded except the case where it is particularly specified that A is the only element thereof.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference characters throughout the drawings for describing the embodiments, and the repetitive description thereof is omitted. Also, in some drawings used in the following embodiments, hatching is used even in a plan view so as to make the drawings easy to see.

Embodiment

Figure 2:
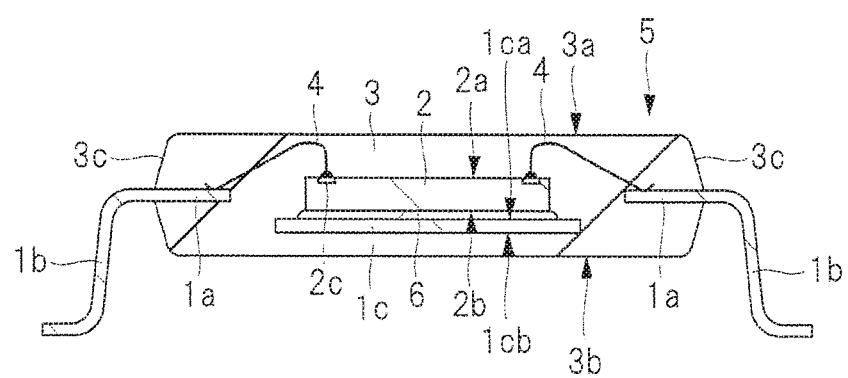
FIG. 2 is a cross-sectional view showing one example of a structure taken along a line A-A of FIG. 1.
Figure 3:
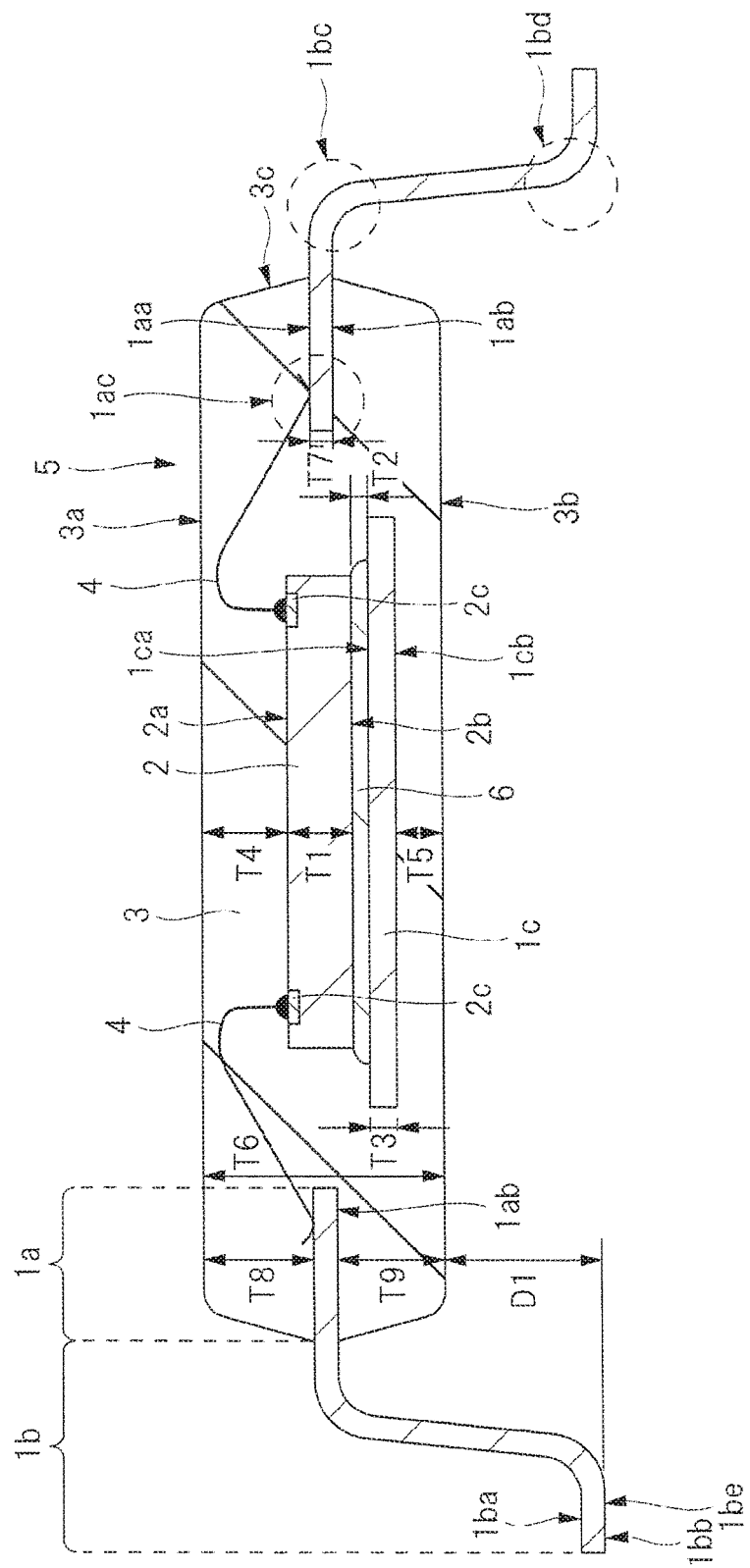
FIG. 3 is an enlarged cross-sectional view showing the detailed structure of the semiconductor device shown in FIG. 1.
Figure 4:
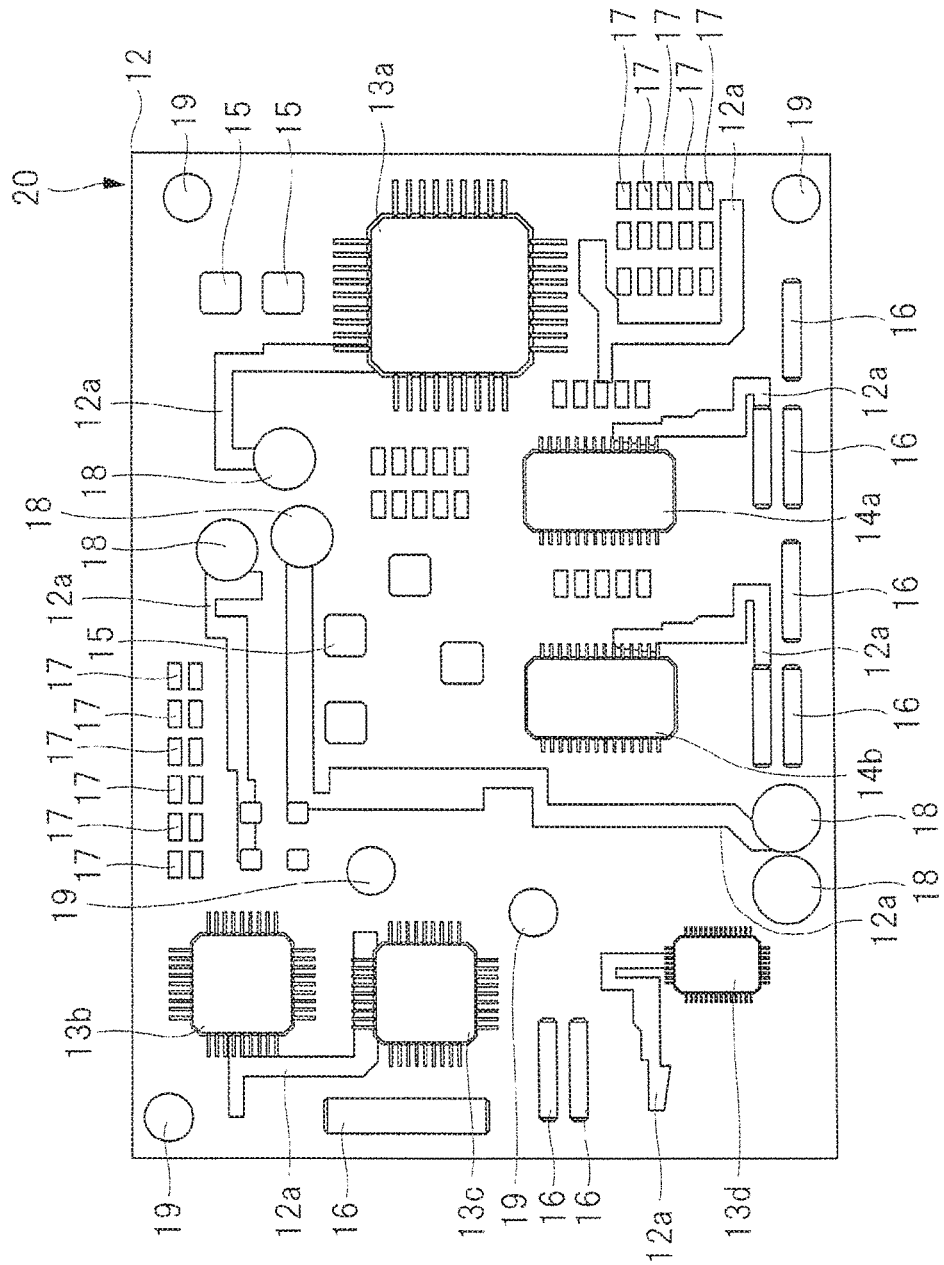
FIG. 4 is a plan view showing one example of a mounting structure onto a mounting board of the semiconductor device of FIG. 1.
Figure 5:
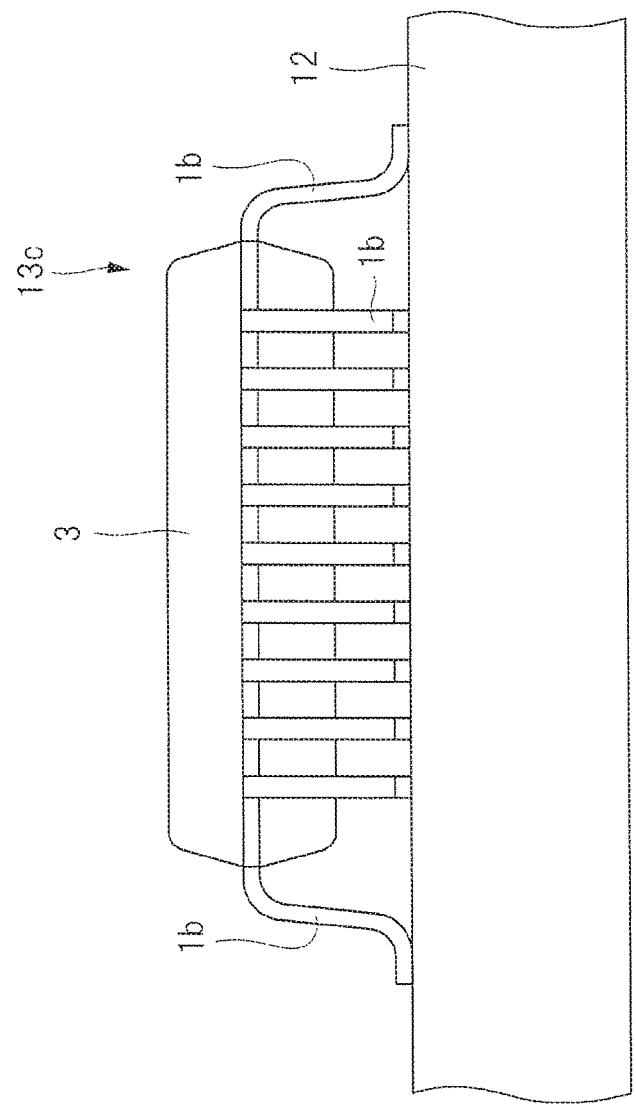
FIG. 5 is a side view showing one example of the mounting structure of the semiconductor device (QFP) shown in FIG. 4.

FIG. 1 is a plan view showing one example of a structure of a semiconductor device of the present embodiment, FIG. 2 is a cross-sectional view showing one example of a structure taken along a line A-A of FIG. 1, FIG. 3 is an enlarged cross-sectional view showing the detailed structure of the semiconductor device shown in FIG. 1, FIG. 4 is a plan view showing one example of a mounting structure onto a mounting board of the semiconductor device of FIG. 1, and FIG. 5 is a side view showing one example of the mounting structure of the semiconductor device (QFP) shown in FIG. 4.

<Electronic Device>

A mounting structure shown in FIG. 4 is a module (electronic device) 20 in which a plurality of semiconductor devices and electronic components are mounted on a motherboard 12 serving as a wiring board. In the description of the present embodiment, an in-vehicle motherboard (mounting board, hereinafter, referred to also as an ECU (Electronic Control Unit) board) 12 is taken as an example. Note that, in the present embodiment, in order to distinguish from electronic components such as capacitors and resistors, electronic components having semiconductor chips mounted therein are described as semiconductor devices.

Of the in-vehicle ECU boards, an ECU board for use in controlling an engine is jointed and fixed to an engine room by pins (bolts) made of metal. Therefore, heat generated in the engine room is conducted to the ECU board via the metal pins.

For this reason, the semiconductor devices and electronic components mounted on the ECU board for use in controlling an engine are used under a severe environment.

As shown in FIG. 4, on the motherboard 12, various semiconductor devices such as QFPs 13a, 13b, 13c and 13d, SOPs (Small Outline Packages) 14a and 14b and others are mounted. Moreover, various electronic components such as capacitors (chip tantalum capacitors 15, laminated ceramic capacitors 17 and aluminum electrolytic capacitors 18) and resistors (including chip resistors) 16 are also mounted thereon. Thus, these semiconductor devices, semiconductor devices and electronic components, or these electronic components are mutually electrically connected with one another via wirings 12a of the motherboard 12.

Furthermore, a plurality of (for example, five) metal pins (bolts) 19 are inserted into the motherboard 12.

In this case, as described above, since the respective pins 19 are coupled to the engine room, heat in the engine room is easily conducted thereto. For this reason, the motherboard 12 constituting the module (electronic device) 20 is likely to be deformed (expanded, contracted, strained, deflected, or the like) in a part near each of the pins 19. In other words, semiconductor devices and electronic components disposed (mounted) near the pins 19 are present under an environment in which a mounting failure is likely to occur in comparison with the semiconductor devices and electronic components that are not disposed (mounted) near the pins 19.

<Semiconductor Device>

The semiconductor device of the present embodiment shown in FIG. 1 and FIG. 2 is a semiconductor package provided with a sealing body which seals a semiconductor chip and a plurality of leads which protrude from the sealing body. In the description of the present embodiment, a QFP (Quad Flat Package) 5 in which a plurality of outer parts (external connection terminals) $1b$ protrude from a sealing body 3 made of resin and the respective outer parts $1b$ are bent into a gull-wing shape is taken as one example of the above-mentioned semiconductor device.

More specifically, the QFP 5 is a semiconductor device in which a plurality of outer parts $1b$ serving as external connection terminals protrude from two pairs of mutually opposed sides of the sealing body 3 having a substantially square shape in its planar shape.

The structure of the QFP 5 will be described below. The QFP 5 is provided with a die pad (chip mounting portion, tab) $1c$ having an upper surface (chip mounting surface) $1ca$ and a lower surface $1cb$ opposite to the upper surface $1ca$, a semiconductor chip 2 mounted on the die pad $1c$, a plurality of leads disposed around the die pad $1c$ and the sealing body 3.

Moreover, the semiconductor chip 2 is provided with a main surface $2a$, a plurality of bonding pads (bonding electrodes) $2c$ formed on the main surface $2a$, and a back surface $2b$ opposite to the main surface $2a$, and as shown in FIG. 2, the semiconductor chip 2 is mounted on the upper surface $1ca$ of the die pad $1c$ via a die bond material 6 such that the back surface $2b$ faces the upper surface $1ca$ of the die pad $1c$. As the die bond material 6, for example, a paste adhesive such as an Ag paste is used, but a film adhesive may also be used.

Moreover, the die pad $1c$ is supported by a plurality of suspension leads (see FIG. 15 to be described later) $1e$, and the plurality of leads that do not support the die pad $1c$ are electrically connected with the plurality of bonding pads $2c$ of the semiconductor chip 2 respectively via a plurality of wires 4.

Each of the plurality of wires 4 is, for example, a gold wire, a copper wire, or the like.

Moreover, the sealing body 3 has an upper surface (front surface) $3a$ positioned on a main surface $2a$ side of the semiconductor chip 2, a lower surface (mounting surface) $3b$ opposite to the upper surface $3a$, and side surfaces $3c$ located between the upper surface $3a$ and the lower surface $3b$, and is made of sealing resin or the like. In this case, the lower surface $3b$ of the sealing body 3 corresponds to a surface located on a lower surface $1cb$ side of the die pad $1c$.

Moreover, the sealing body 3 seals the die pad $1c$, the other parts (inner parts) of the plurality of leads, the semiconductor chip 2 and the plurality of wires 4 such that one parts (outer parts) of the plurality of leads protrude from the side surfaces $3c$.

In other words, of the plurality of leads, parts buried in the sealing body 3 correspond to inner parts $1a$, and parts protruding externally from the side surfaces $3c$ of the sealing body 3 correspond to outer parts (one parts) $1b$. Moreover, in each of the plurality of leads, the inner part $1a$ and the outer part $1b$ are integrally formed as one unit.

Furthermore, one part (outer part) of each of the plurality of leads is bent on the outside of the sealing body 3. More specifically, each of the outer parts $1b$ of the plurality of leads is bent into a gull-wing shape.

Also, the outer part $1b$ of each of the plurality of leads has a surface coated with a plating film (metal film) 7 (except for a 16 cut surface, see FIG. 29 to be described later).

Note that the sealing body 3 is made of, for example, thermosetting epoxy-based resin.

Moreover, the semiconductor chip 2 is composed of, for example, a base material made of silicon and a multilayer wiring layer that is formed on an element formation surface of the base material and has a thickness smaller than that of the base material.

In the QFP 5 of the present embodiment, the sealing body 3 is partially disposed above the main surface $2a$ of the semiconductor chip 2 and below the lower surface $1cb$ of the die pad $1c$. More specifically, the QFP 5 is a semiconductor device having a so-called tab embedded structure in which the die pad $1c$ is buried in the sealing body 3.

Moreover, in the QFP 5, the thickness T1 of the semiconductor chip 2 is larger than the thickness T5 from the lower surface $1cb$ of the die pad $1c$ to the lower surface $3b$ of the sealing body 3 as shown in FIG. 3. In this case, T1 is, for example, 0.4 mm, and T5 is, for example, 0.39 mm.

Note that the QFP 5 is a semiconductor device whose occupancy ratio of the semiconductor chip 2 inside the sealing body 3 is high. In this case, the occupancy ratio of the semiconductor chip 2 refers to a ratio (dominating amount) of the thickness of the semiconductor chip 2 relative to the total thickness of the sealing body 3 in the thickness direction of the sealing body 3. Therefore, as one example of a comparison target for the chip thickness, the thickness of the sealing body 3 below the chip is proposed. In the QFP 5, as described above, the thickness T5 of the sealing body 3 below the lower surface $1cb$ of the die pad $1c$ is smaller than the thickness T1 of the semiconductor chip 2.

Furthermore, in the QFP 5, a distance D1 from the lower surface $3b$ of the sealing body 3 to each of the tip portions (main joint surfaces) $1be$ of the respective outer parts $1b$ of the plurality of leads is larger than a thickness T4 of the sealing body 3 from the main surface $2a$ of the semiconductor chip 2 to the upper surface $3a$ of the sealing body 3. In this case, D1 is, for example, 0.73 mm, and T4 is, for example, 0.47 mm.

Note that the above-mentioned distance D1 is a stand-off amount of the QFP 5 of the present embodiment. The stand-off amount of the QFP 5 is a distance from the lower surface $3b$ of the sealing body 3 to the lowermost point of the tip portion $1be$ of the outer part $1b$. At this time, with respect to the accurate lowermost point, an average of three sides of bottommost points on a bottom surface 0.1 mm inner than the tip end of the outer part $1b$ is determined as a virtual plane by taking into account the scanner dimensional inspection, and this virtual plane is defined as the lowermost point. Moreover, in the tip portion $1be$ of each of the outer parts $1b$, a surface (lower surface $1bb$) facing the surface of the electrode pad (for example, terminal $12b$ of the motherboard 12 shown in FIG. 31) of the motherboard 12 on which the QFP 5 is mounted (solder-bonded) is defined as a main joint surface. More specifically, since the tip portion $1be$ of each outer part $1b$ corresponds to a surface on which a solder material wets up, all the surfaces (except for a cut surface) on which the above-mentioned plating film 7 is formed serve as joint surfaces, but since the surface (lower surface 1*bb*) facing the electrode pad of the mounting board mainly serves as a joint surface, this surface is defined as the main joint surface.

Moreover, each of the plurality of inner parts 1*a* of the QFP 5 has a wire joint portion 1*ac* to which the wire 4 is bonded and which is sealed with the sealing body 3. On the other hand, each of the plurality of outer parts 1*b* has a bending portion 1*bc* that is bent in the thickness direction of the sealing body 3 and a bending portion 1*bd* that is bent in a direction parallel with the upper surface 3*a* of the sealing body 3, so that the bending portion 1*bc* and the bending portion 1*bd* form a gull-wing shape.

Note that each of the bending portion 1*bc* and the bending portion 1*bd* is formed in the outer part 1*b* and thus exposed from the sealing body 3, and the bending portion 1*bc* is disposed so as to be spaced apart from the semiconductor chip 2 compared with the wire joint portion 1*ac* of the inner part 1*a*, while the bending portion 1*bd* is formed at a position spaced apart from the semiconductor chip 2 compared with the bending portion 1*bc*.

Moreover, a distance (gap, D1 (stand-off amount)) of each of the plurality of outer parts 1*b* from the lower surface 3*b* of the sealing body 3 to the bending portion 1*bd* is larger than a thickness T8 from the upper surface 1*aa* of each of the wire joint portions 1*ac* of the plurality of inner parts 1*a* to the upper surface 3*a* of the sealing body 3 or a thickness T9 from the lower surface lab of each of the wire joint portions 1*ac* of the plurality of inner parts 1*a* to the lower surface 3*b* of the sealing body 3.

More specifically, in the QFP 5, D1>T8 or D1>T9 is satisfied. In this case, in the QFP 5, both of T8 and T9 are, for example, 0.64 mm, but T8 and T9 are not necessarily equal to each other.

Moreover, in the QFP 5, the distance (gap, D1 (stand-off amount)) from the lower surface 3*b* of the sealing body 3 to each of the tip portions 1*be* of the plurality of outer parts 1*b* is larger than the thickness of the semiconductor chip 2. More specifically, in the QFP 5, D1>T1 is satisfied.

Next, the differences between the QFP 5 of the present embodiment and QFP, LQFP (Low Profile Quad Flat Package) and TQFP (Thin Quad Flat Package) based on JEITA (Japan Electronics and Information Technology Industries Association) will be described.

Figure 6:
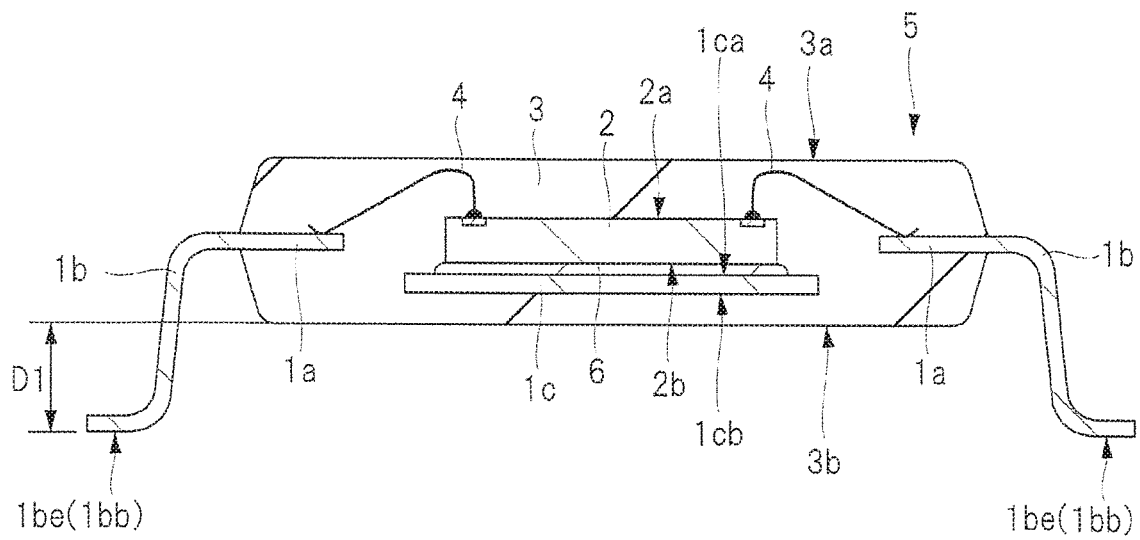
FIG. 6 is a cross-sectional view showing the structure of the semiconductor device (QFP) of the embodiment.
Figure 7:
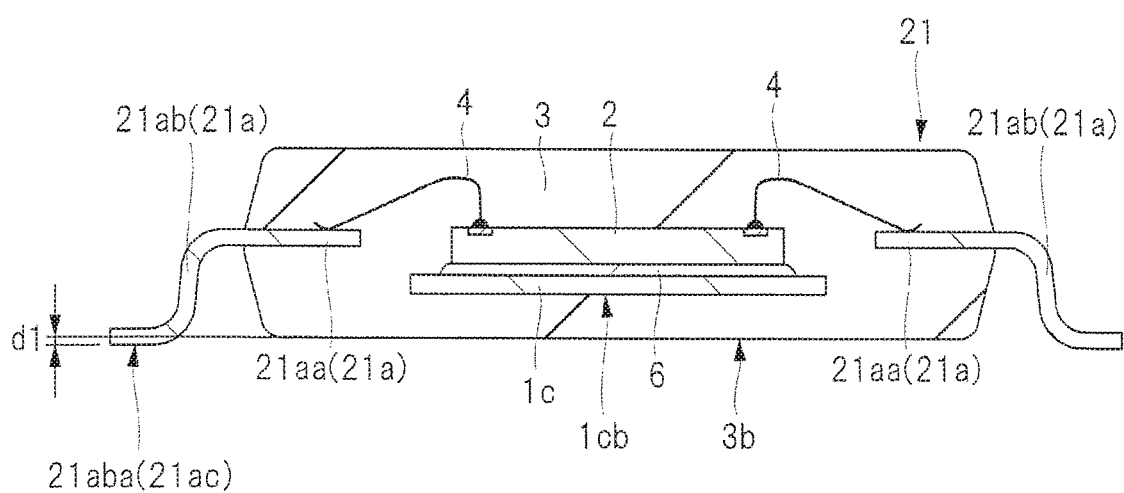
FIG. 7 is a cross-sectional view showing a structure of a QFP of a comparative example.
Figure 8:
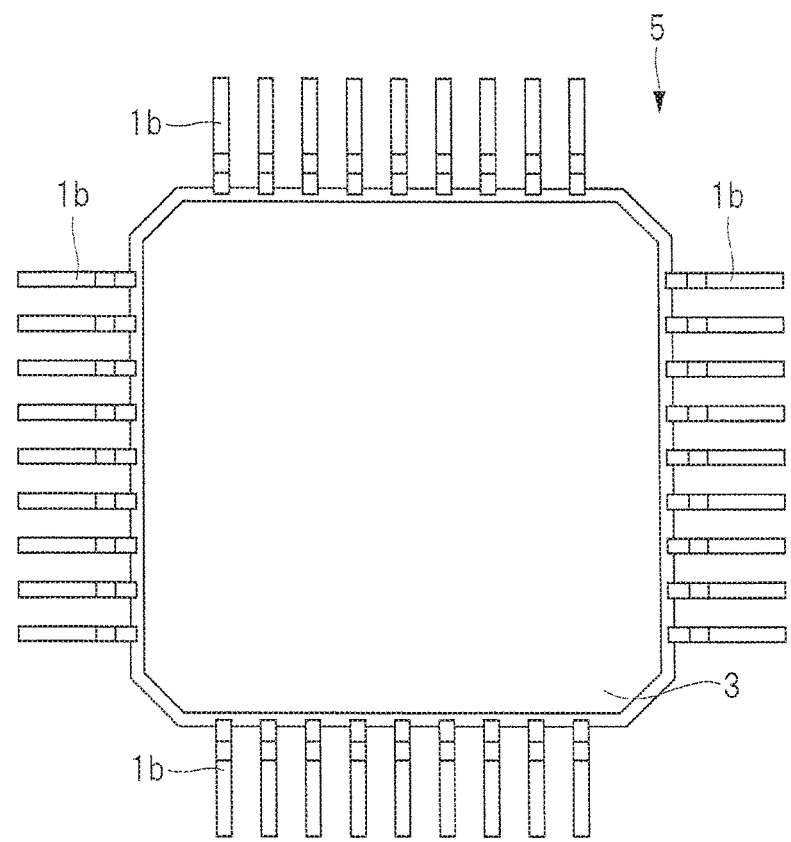
FIG. 8 is a plan view showing one example of a structure of the semiconductor device of the embodiment.
Figure 9:
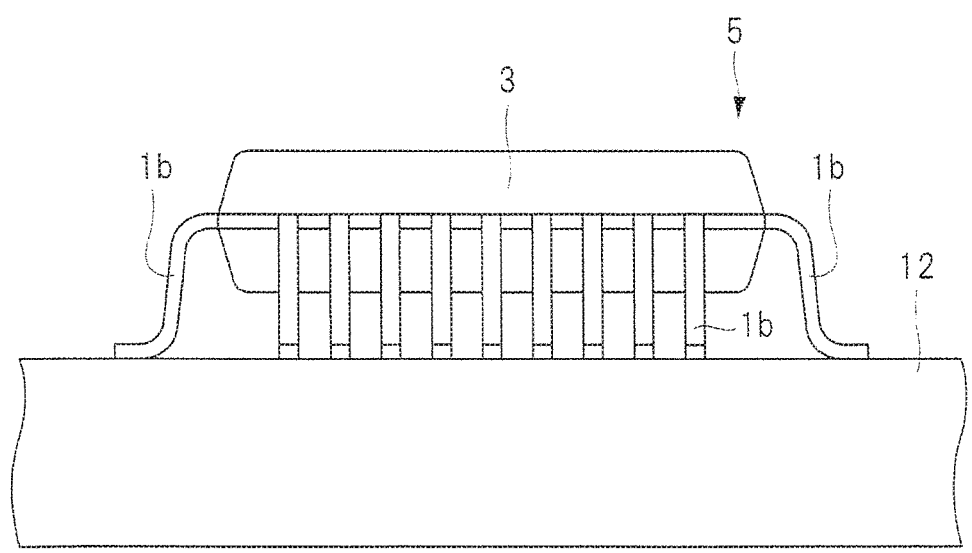
FIG. 9 is a side view showing the mounting structure of the semiconductor device shown in FIG. 8.
Figure 10:
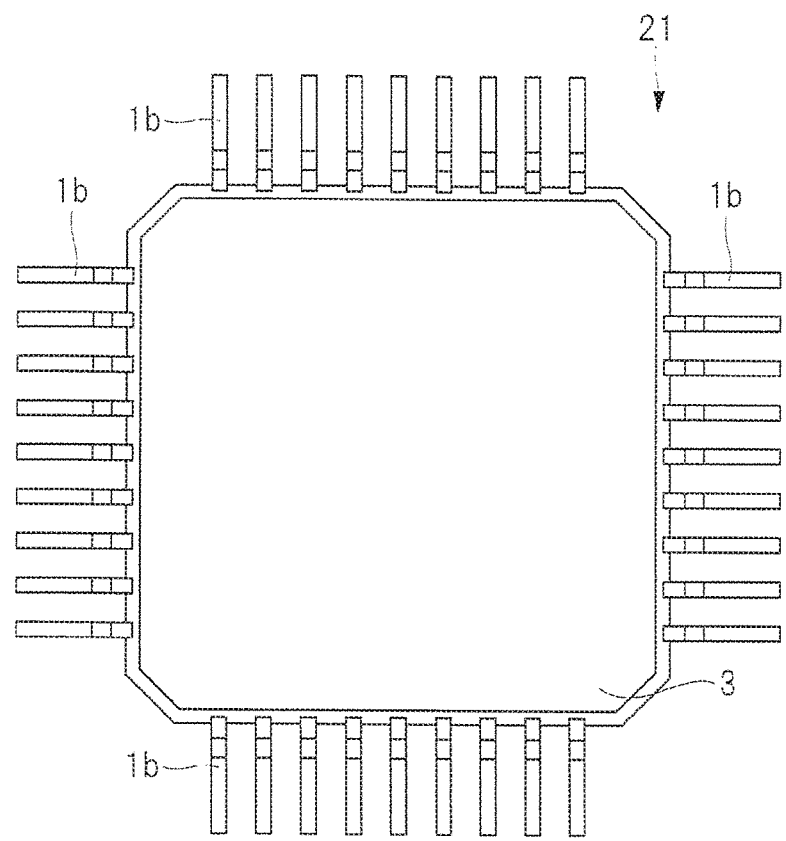
FIG. 10 is a plan view showing the structure of the QFP of the comparative example.
Figure 11:
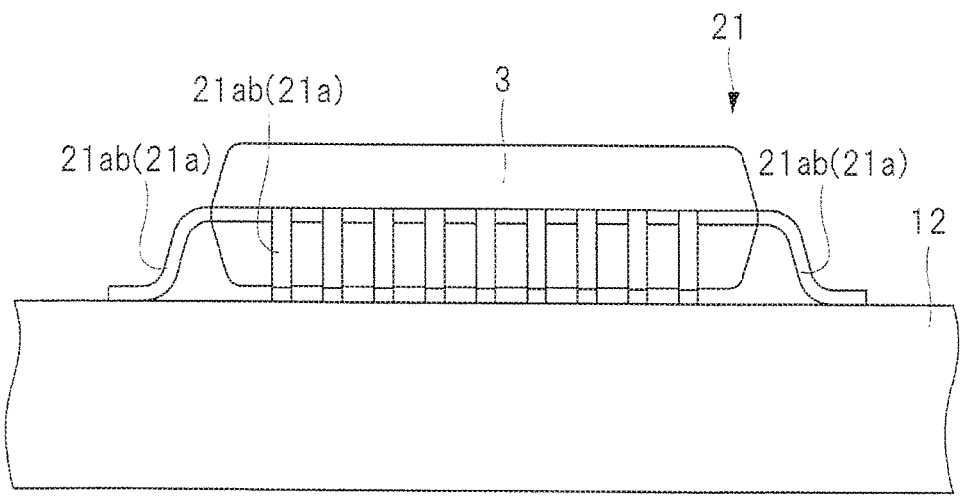
FIG. 11 is a side view showing the mounting structure of the semiconductor device shown in FIG. 10.

FIG. 6 is a cross-sectional view showing the structure of the semiconductor device (QFP) of the present embodiment, FIG. 7 is a cross-sectional view showing the structure of a QFP of a comparative example, FIG. 8 is a plan view showing one example of the structure of the semiconductor device of the present embodiment, FIG. 9 is a side view showing the mounting structure of the semiconductor device shown in FIG. 8, FIG. 10 is a plan view showing the structure of the QFP of the comparative example, and FIG. 11 is a side view showing the mounting structure of the semiconductor device shown in FIG. 10.

As described above, the QFP 5 of the present embodiment is a semiconductor device having a large stand-off amount (D1).

The thickness of the sealing body 3 of the QFP 5 of the present embodiment shown in FIG. 6 is, for example, T6=1.40 mm as shown in FIG. 3. On the other hand, the thicknesses of the sealing bodies of the QFP, LQPF and TQFP based on JEITA are 2.00 mm, 1.40 mm and 1.00 mm, respectively.

Moreover, the stand-off amount of the QFP 5 of the present embodiment is, for example, D1=0.73 mm as shown in FIG. 3. On the other hand, the stand-off amounts (for example, dl of QFP 21 shown in FIG. 7) of all the QFP, LQPF and TQFP based on JEITA are 0.10 mm in the low-stand value and 0.40 mm in the high-stand value.

That is, the QFP 5 of the present embodiment has a structure based on JEITA and the thickness of the sealing body 3 corresponds to that of the LQFP of JEITA, while the length of each outer part 1*b* (in particular, the length in the thickness direction of the sealing body 3) is made longer, so that the stand-off amount is larger than the stand-off amount (in particular, the high-stand value) of each of the QFP, LQFP and TQFP based on JEITA.

In other words, in the mounting structure on the motherboard (wiring board) 12, the distance (gap) between the sealing body 3 and the motherboard 12 is larger in the QFP 5 of the present embodiment as shown in FIG. 8 to FIG. 11.

Note that the QFP 21 shown in FIG. 7 has the same structure as that of the LQFP based on JEITA, and with respect to a plurality of leads 21*a* each made up of an inner part 21*aa* and an outer part 21*ab*, the stand-off amount dl corresponding to a distance between a lower surface 21*aba* of the tip portion 21*ac* of the outer part 21*ab* and the lower surface 3*b* of the sealing body 3 is smaller than the thickness of the semiconductor chip 2 and a distance between the lower surface 1*cb* of the die pad 1*c* and the lower surface 3*b* of the sealing body 3.

More specifically, in comparison with the stand-off amount D1 of the QFP 5 of the present embodiment, the stand-off amount dl of the QFP 21 is extremely small.

Here, as the comparison target of the QFP 5 of the present embodiment, one example of dimensions of the respective components of the LQFP and TQFP will be described.

The thicknesses of the semiconductor chips 2 are LQFP=0.40 mm and TQFP=0.28, the thicknesses of the die bond materials 6 are 0.02 mm in both of the LQFP and TQFP, and the thicknesses of the lead frames (inner part, outer part, and others) are LQFP=0.125 mm or 0.15 mm and TQFP=0.15 mm.

Moreover, the thicknesses from the chip surface to the upper surface 3*a* of the sealing body 3 are LQFP=0.59 mm and TQFP=0.33 mm, and the thicknesses from the lower surface 1*cb* of the die pad 1*c* to the lower surface 3*b* of the sealing body 3 are LQFP=0.38 mm and TQFP=0.23 mm (in this case, the lowering amount of the die pad 1*c* caused by the bending of the suspension leads 1*e* is assumed to be 0.24 mm). Note that the above-mentioned numerical values are given by way of example and various modifications may be made.

Since the thickness of the sealing body 3 corresponds to that of the LQFP based on JEITA as described above, the QFP 5 of the present embodiment is a semiconductor device in which the reduction in thickness of the sealing body 3 is achieved. However, it is difficult to miniaturize the semiconductor chip 2 because of its highly functional properties. Therefore, the QFP 5 of the present embodiment is a semiconductor device in which the occupancy ratio of the semiconductor chip 2 inside the sealing body 3 tends to be high, so that rigidity of the semiconductor device main body is also high.

For example, in the QFP 5, the planar shape of the sealing body 3 is a square shape with one side of about 5 to 6 mm, and the planar shape of the semiconductor chip 2 is a rectangular shape or a square shape with one side of about 2 to 2.5 mm.

In the case where the QFP 5 having such a high occupancy ratio of the semiconductor chip 2 inside the sealing body 3 is mounted on a wiring board such as the motherboard 12 or the like, if the board is warped due to an influence of heat or the like, the movement of the QFP 5 hardly follows the warping of the board because the rigidity of the QFP main body (sealing body 3) is high.

Therefore, in the QFP 5 of the present embodiment, by increasing the stand-off amount of each of the outer parts 1b, the movement of the main body (sealing body 3) is made to easily follow the warping of the board.

Next, main components and linear expansion coefficients of the semiconductor chip 2, the sealing body 3 and the die pad 1c (same as the respective leads) will be described. Note that the thermal expansion coefficient includes a linear expansion coefficient that is an index of the expansion rate in a linear direction and a volume expansion coefficient that is an index of the expansion rate in a three-dimensional space, and as a cause of occurrence of a stress due to a temperature cycle load, the difference in the linear expansion coefficient gives great influences.

Therefore, in the present embodiment, the description will be made while focusing on the linear expansion coefficient.

In the QFP 5, the semiconductor chip 2 is mainly made of silicon and the linear expansion coefficient thereof is 4 to 5 ppm/° C., and the sealing body 3 (resin) is mainly made of epoxy resin and the linear expansion coefficient thereof is 8 to 12 ppm/° C. Therefore, the linear expansion coefficient of the semiconductor chip 2 is smaller than the linear expansion coefficient of the sealing body 3.

Moreover, the lead frame 1 (see FIG. 14 to be described later) including the die pad 1c is mainly made of a copper (Cu) material and the linear expansion coefficient thereof is 17 ppm/° C.

Furthermore, the motherboard 12 on which the QFP 5 is mounted is mainly made of a resin material and the linear expansion coefficient thereof is, for example, about 15 ppm/° C.

As described above, since the linear expansion coefficient of the semiconductor chip 2 is smaller than the linear expansion coefficient of the sealing body 3, the linear expansion coefficient of the QFP 5 itself is lowered when the occupancy ratio of the semiconductor chip 2 inside the sealing body 3 is increased, so that the rigidity of the QFP main body (sealing body 3) becomes higher as described above.

Next, a problem of joint failure at the time of mounting the semiconductor device having a high occupancy ratio of the semiconductor chip 2 inside the sealing body 3 onto the board will be described.

The sealing body 3 of the QFP 5 is made of thermosetting epoxy-based resin, while the semiconductor chip 2 is formed of a base material made of silicon and a multilayer wiring layer (having insulating layers between respective wiring layers) that is formed on an element formation surface of the base material and thinner than the base material. For this reason, the linear expansion coefficient of the semiconductor chip 2 (4 to 5 ppm) is smaller than the linear expansion coefficient of the sealing body 3 (8 to 12 ppm).

Note that, in the present embodiment, for example, the thickness of the semiconductor chip 2 (LQFP: 0.40 mm, TQFP: 0.28 mm) is larger than the thickness of the sealing body 3 from the lower surface 1cb of the die pad 1c to the lower surface 3b of the sealing body 3 (LQFP: 0.38 mm, TQFP: 0.23 mm).

In recent years, with the miniaturization (thickness reduction) of a semiconductor device, the whole thickness of the sealing body 3 tends to become smaller. Consequently, with the reduction of the whole thickness of the sealing body 3, the thickness of the sealing body 3 located below the die pad 1c becomes smaller than the thickness of the semiconductor chip 2. As a result, the occupancy ratio of the semiconductor chip 2 inside the sealing body 3 is increased, so that the linear expansion coefficient of the semiconductor device itself is decreased (the rigidity of the semiconductor device main body (sealing body 3) is increased).

Figure 31:
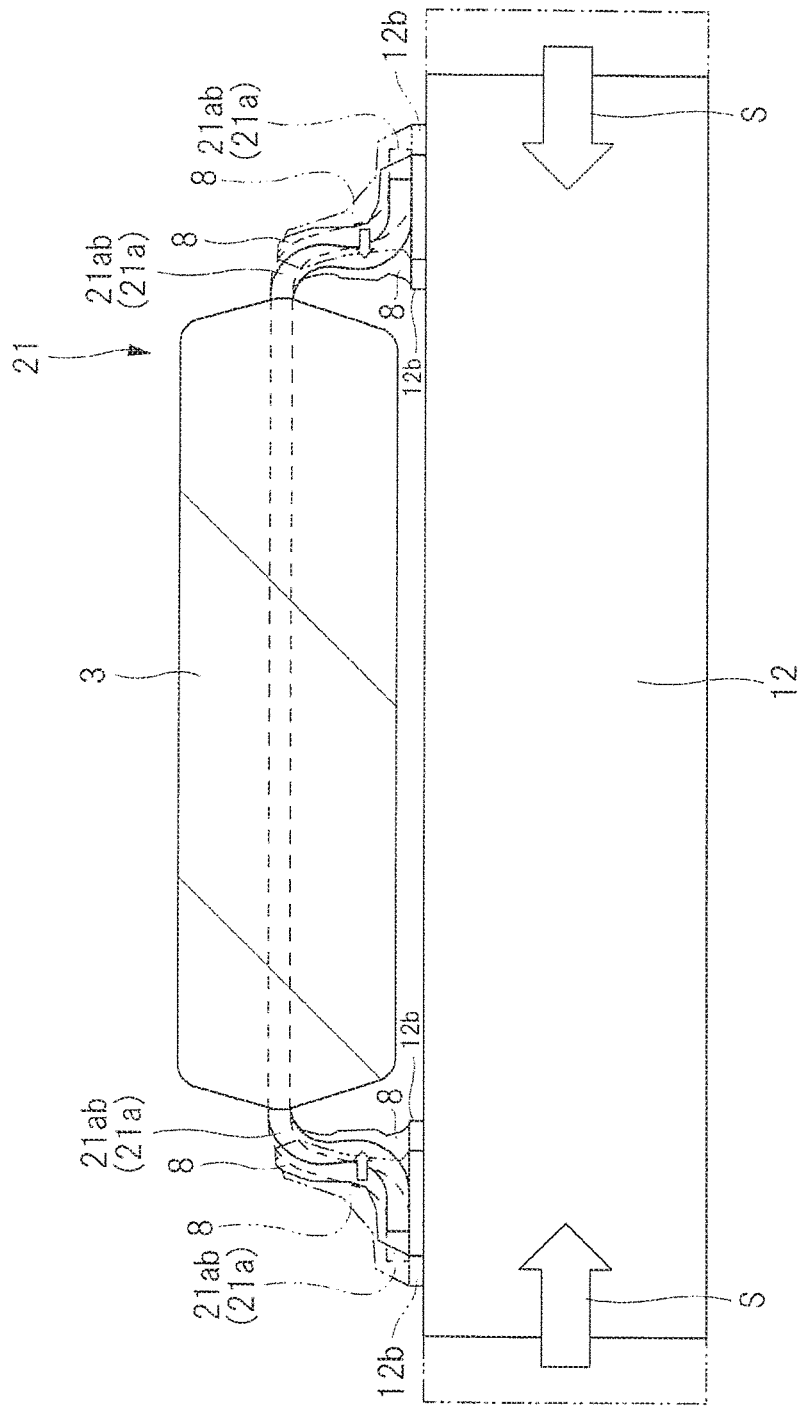
FIG. 31 is a conceptual diagram showing a mounting structure onto a motherboard of the semiconductor device of the comparative example.

Consequently, as shown in the comparative example of FIG. 31, when the motherboard 12 is contracted in a direction S due to an influence of heat or the like in the structure in which the QFP 21 is mounted on the motherboard 12 serving as the wiring board, the movement of the QFP 21 hardly follows the warping of the motherboard 12 because of a high rigidity of the QFP 21 main body (sealing body 3).

More specifically, in a joint portion between the motherboard 12 and the QFP 21 mounted on the motherboard 12 (joint portion between the outer part 21ab and the terminal (electrode pad) 12b via solder 8), when the motherboard 12 having the QFP 21 mounted thereon is deformed due to an influence of heat, since the amount of deformation of the motherboard 12 differs from the amount of deformation of the QFP 21 similarly deformed due to the influence of heat, a joint failure occurs in the above-mentioned joint portion.

However, in the QFP 5 of the present embodiment, since the stand-off amount of each of the plurality of outer parts 1b is large, the movement of the QFP 5 main body (sealing body 3) is allowed to easily follow the warping of the motherboard 12.

Figure 12:
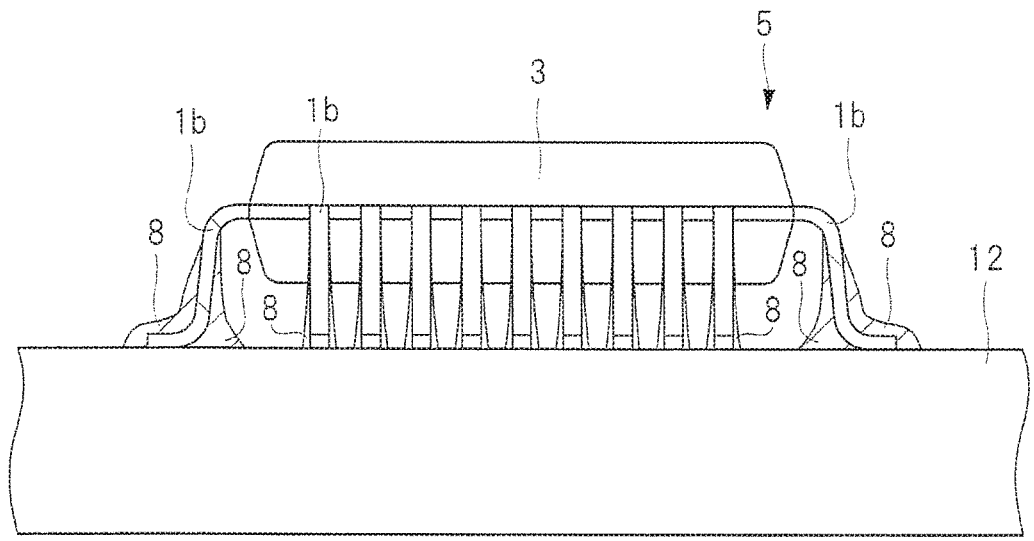
FIG. 12 is a conceptual diagram showing a solder wet-up state in the semiconductor device shown in FIG. 8.

In this case, FIG. 12 is a diagram showing a solder wet-up state in the QFP 5 of the present embodiment. As shown in FIG. 12, since the stand-off amount of each outer part 1b is large in the QFP 5, the wet-up of the solder 8 in each outer part 1b is increased in the height direction of each of the outer parts 1b.

As a result, the strength of the solder bonding is enhanced between each of the outer parts 1b and the joint portion. Moreover, since the movement of the QFP 5 main body (sealing body 3) is allowed to easily follow the warping of the motherboard 12 as described above, it is possible to ensure high mounting reliability (mounting strength) in the QFP 5.

In other words, even in the QFP 5 in which the linear expansion coefficient of the main body (sealing body 3) is small, its mounting reliability (mounting strength) can be enhanced, so that it is possible to reduce the occurrence of the joint failure to the mounting board (motherboard 12).

Moreover, since the amount of the wet-up of the solder 8 is increased in each of the outer parts 1b, it is possible to improve the electric characteristics of the QFP 5.

Note that, even in the semiconductor device of a die-pad embedded type in which heat is easily accumulated in the sealing body 3 and a thermal stress is likely to be applied like the QFP 5 of the present embodiment, it is possible to improve the mounting reliability (mounting strength).

Next, a problem of the joint failure in a semiconductor device 6 in a mounting structure (module 20) of the semiconductor device onto the motherboard 12 (in-vehicle ECU board or the like) shown in FIG. 4 will be described.

Of the in-vehicle ECU boards, an ECU board for use in controlling an engine is jointed and fixed to an engine room by pins (bolts) made of metal. Therefore, since heat generated in the engine room is conducted to the ECU board via the metal pins, the semiconductor devices and electronic components mounted on the ECU board for use in controlling an engine are used under a severe environment.

Concretely, the motherboard (for example, ECU board) 12 on which semiconductor devices are mounted is fixed to the engine room by a plurality of pins (bolts) 19. Since the respective pins 19 are made of metal, the temperature of the pins 19 is easily raised when the operating environment thereof is exposed to a high temperature.

As a result, the motherboard 12 tends to be easily warped (strained) in the vicinity of the respective pins 19 in comparison with other regions (regions spaced apart from the pins 19). Thus, the joint failure is likely to occur in the semiconductor devices disposed (mounted) in the vicinity of the pins 19 in comparison with the semiconductor devices disposed in the other regions.

For example, in the module 20 shown in FIG. 4, QFPs 13b and 13c have two pins 19 disposed adjacent thereto. Therefore, by adopting the structure having a large stand-off amount of the present embodiment to these QFPs 13b and 13c, it is possible to enhance the mounting reliability (mounting strength) even in the QFPs 13b and 13c that tend to be subjected to the thermal influence. As a result, it becomes possible to reduce the joint failure to the motherboard 12 (ECU board).

It is needless to say that the structure of the present embodiment having a large stand-off amount may be applied also to a semiconductor device disposed in a region spaced apart from the pins 19.

For example, in the module 20, the structure of the present embodiment having a large stand-off amount may be applied to the QFP 13a and QFP 13d or SOP 14a and SOP 14b. In this manner, the mounting reliability (mounting strength) of these semiconductor devices can be further improved.

Figure 13:
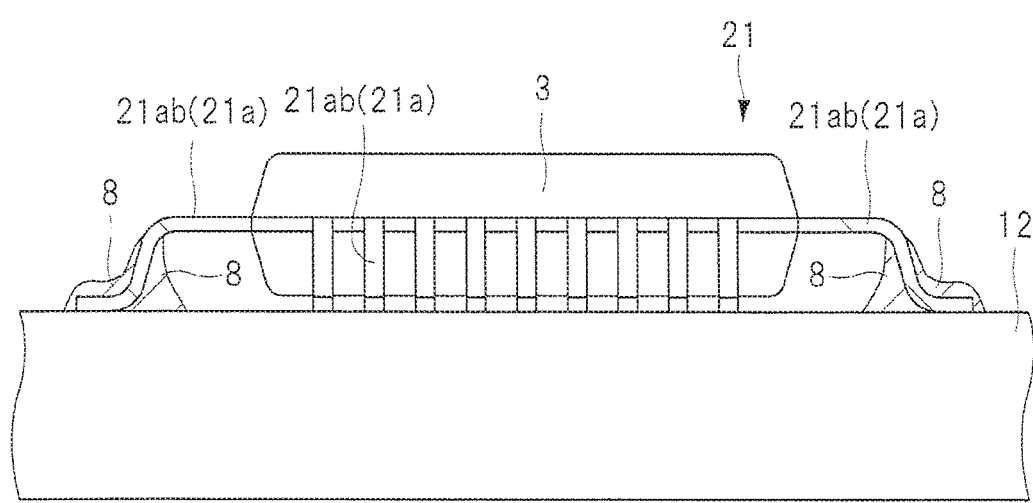
FIG. 13 is a conceptual diagram showing a solder wet-up state in the semiconductor device of the comparative example.

Note that, in the semiconductor device, in place of increasing the stand-off amount of each of the outer parts 1b, it is proposed to use the structure of the QFP 21 shown in FIG. 13. FIG. 13 is a conceptual diagram showing a solder wet-up state in the semiconductor device of the comparative example.

The QFP 21 shown in FIG. 13 has a structure in which each of the outer parts 21ab is extended long in the direction of the mounting surface of the board. In the case of the QFP 21 of FIG. 13, since the wet-up amount of the solder 8 is smaller than that of the QFP 5 of the present embodiment, it is not possible to sufficiently enhance the mounting reliability (mounting strength).

More specifically, since the wet-up of the solder 8 has directionality, the wet-up of the solder 8 stops at the bending portion of the outer part 21ab in the case of the QFP 21 of FIG. 13. Therefore, it is not possible to ensure the sufficient mounting reliability (mounting strength) equivalent to that of the QFP 5 of the present embodiment, and failing to withstand the use in such a severe environment as that of the motherboard 12 (ECU board) of the module 20 shown in FIG. 4.

<Manufacturing Method of Semiconductor Device>

Figure 14:
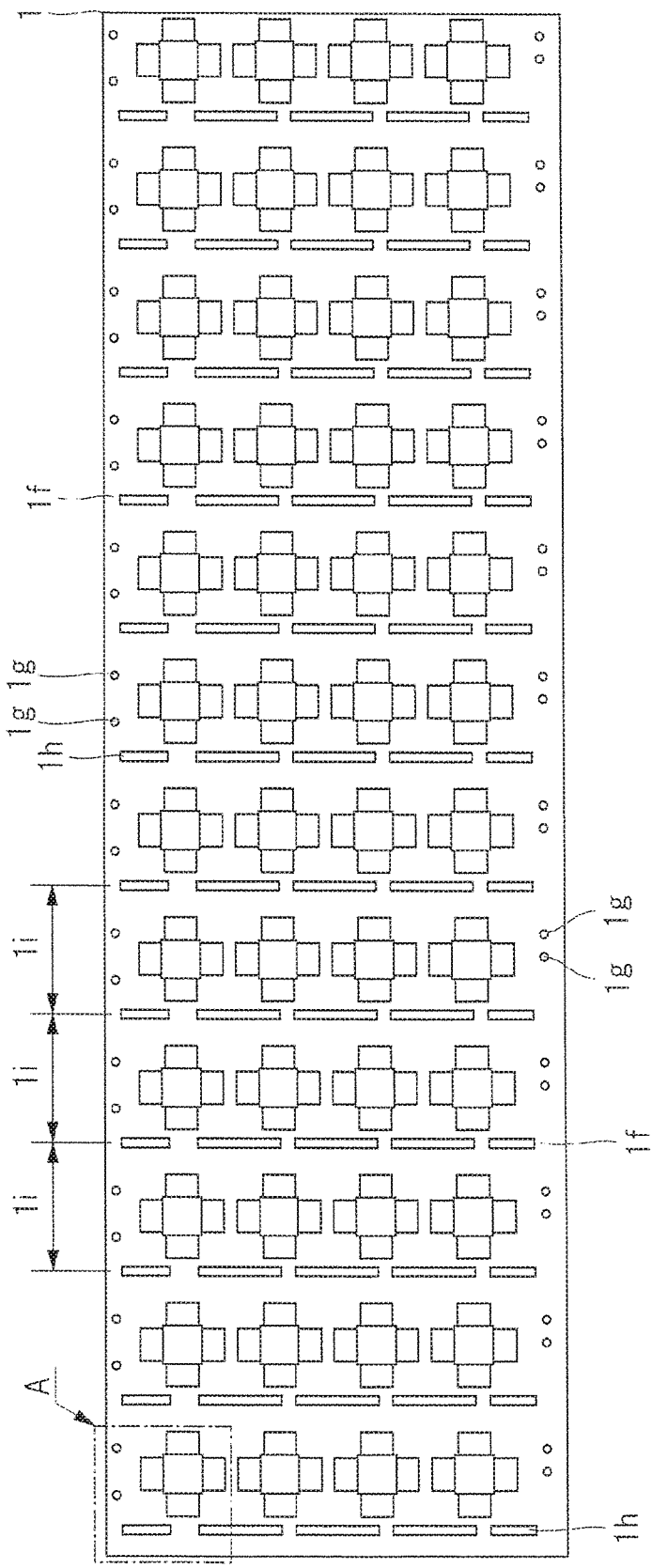
FIG. 14 is a plan view showing one example of a structure of a lead frame for use in the assembling of the semiconductor device of FIG. 1.
Figure 15:
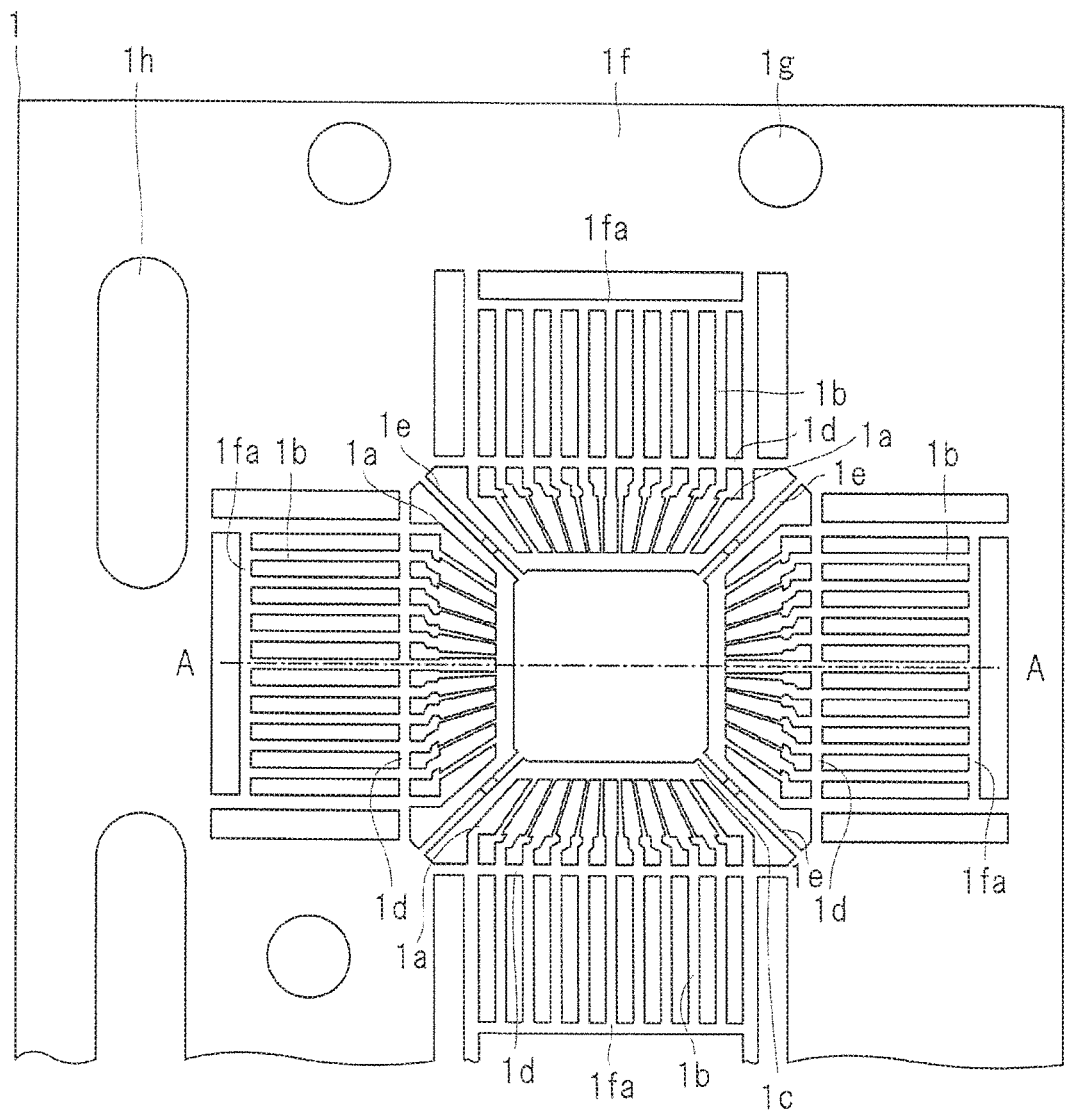
FIG. 15 is a partially enlarged plan view showing the structure of a part A of FIG. 14 in an enlarged manner.
Figure 17:
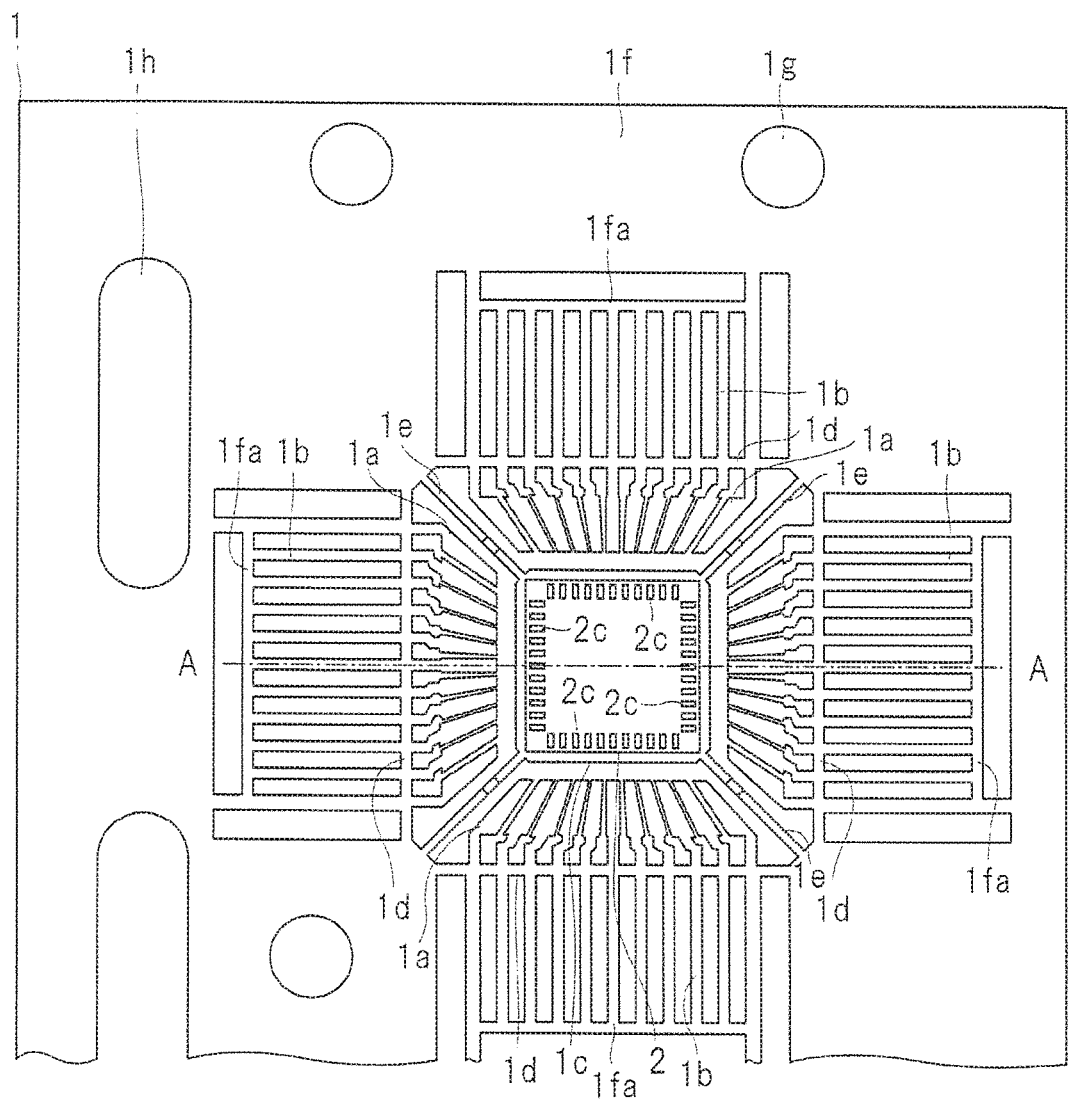
FIG. 17 is a partially enlarged plan view showing one example of a structure after die bonding in the assembling of the semiconductor device of FIG. 1.
Figure 18:
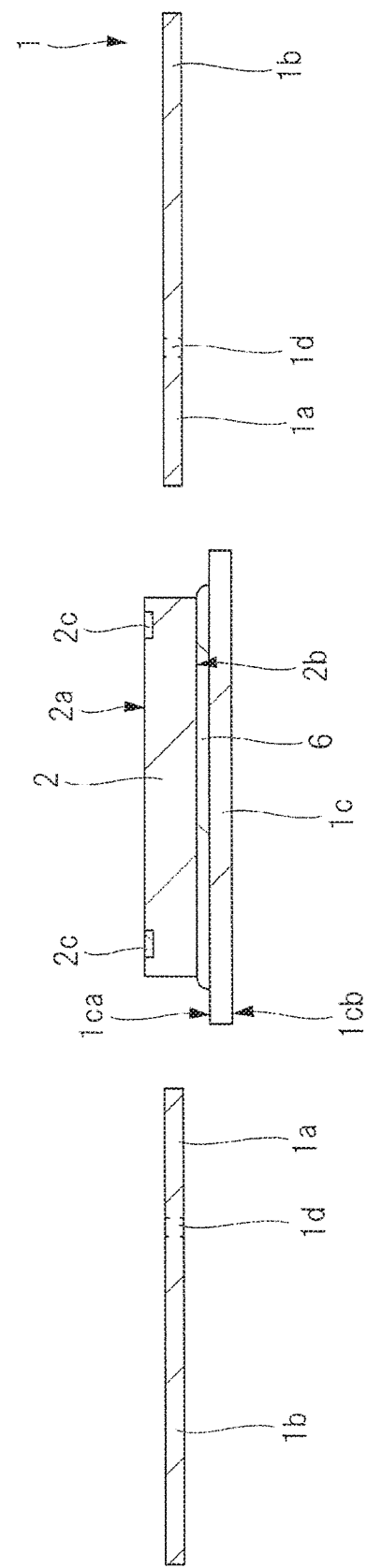
FIG. 18 is a cross-sectional view showing one example of a cross-sectional structure taken along a line A-A of FIG. 17.

FIG. 14 is a plan view showing a structure of a lead frame for use in the assembling of the semiconductor device of FIG. 1, FIG. 15 is a partially enlarged plan view showing the structure of a part A of FIG. 14 in an enlarged manner, FIG. 16 is a cross-sectional view showing a cross-sectional structure taken along a line A-A of FIG. 15, FIG. 17 is a partially enlarged plan view showing a structure after die bonding in the assembling of the semiconductor device of FIG. 1, and FIG. 18 is a cross-sectional view showing a cross-sectional structure taken along a line A-A of FIG. 17.

Figure 19:
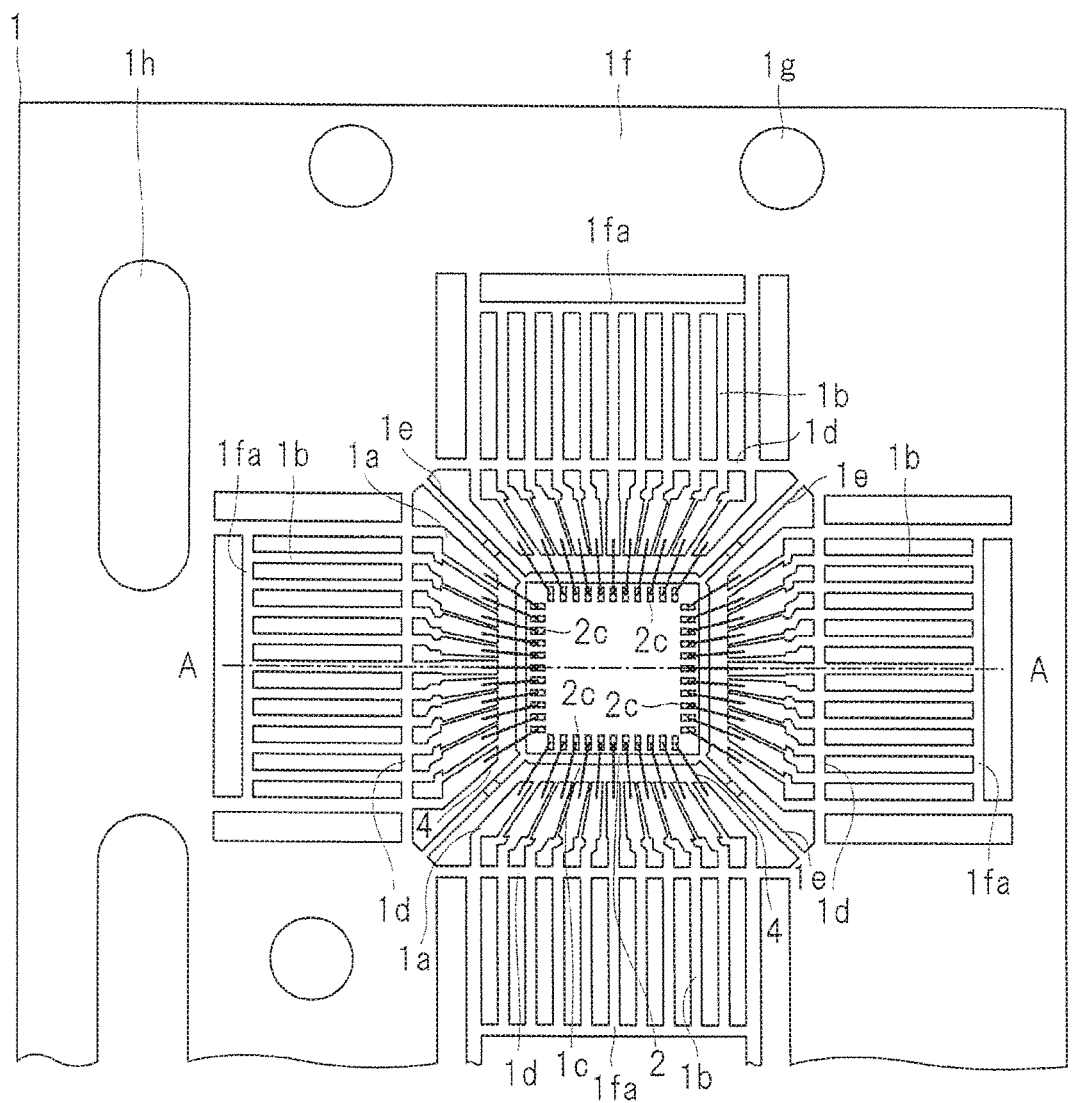
FIG. 19 is a partially enlarged plan view showing one example of a structure after wire bonding in the assembling of the semiconductor device of FIG. 1.
Figure 20:
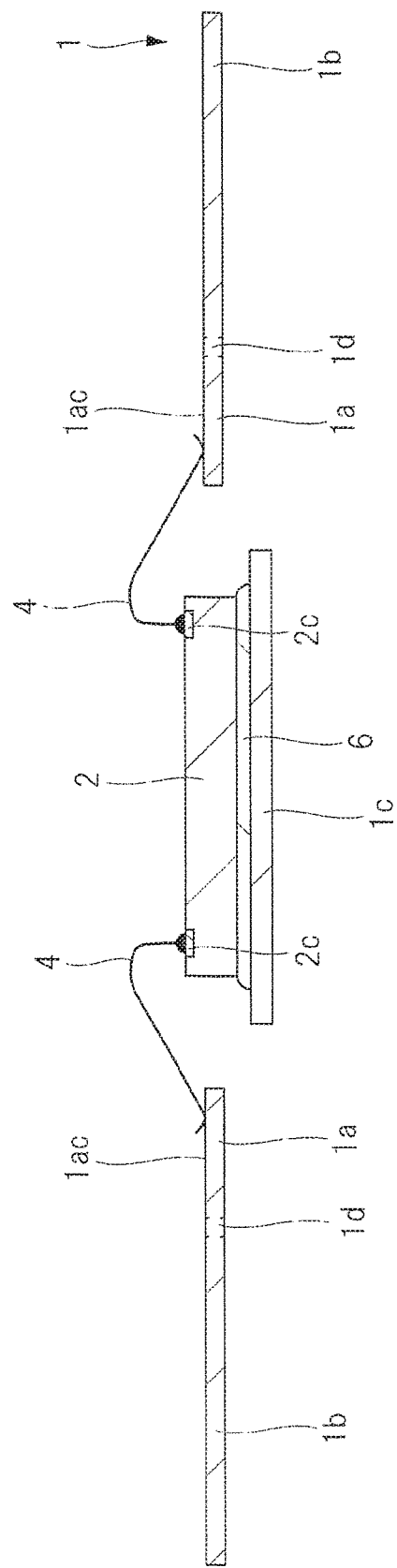
FIG. 20 is a cross-sectional view showing one example of a cross-sectional structure taken along a line A-A of FIG. 19.
Figure 21:
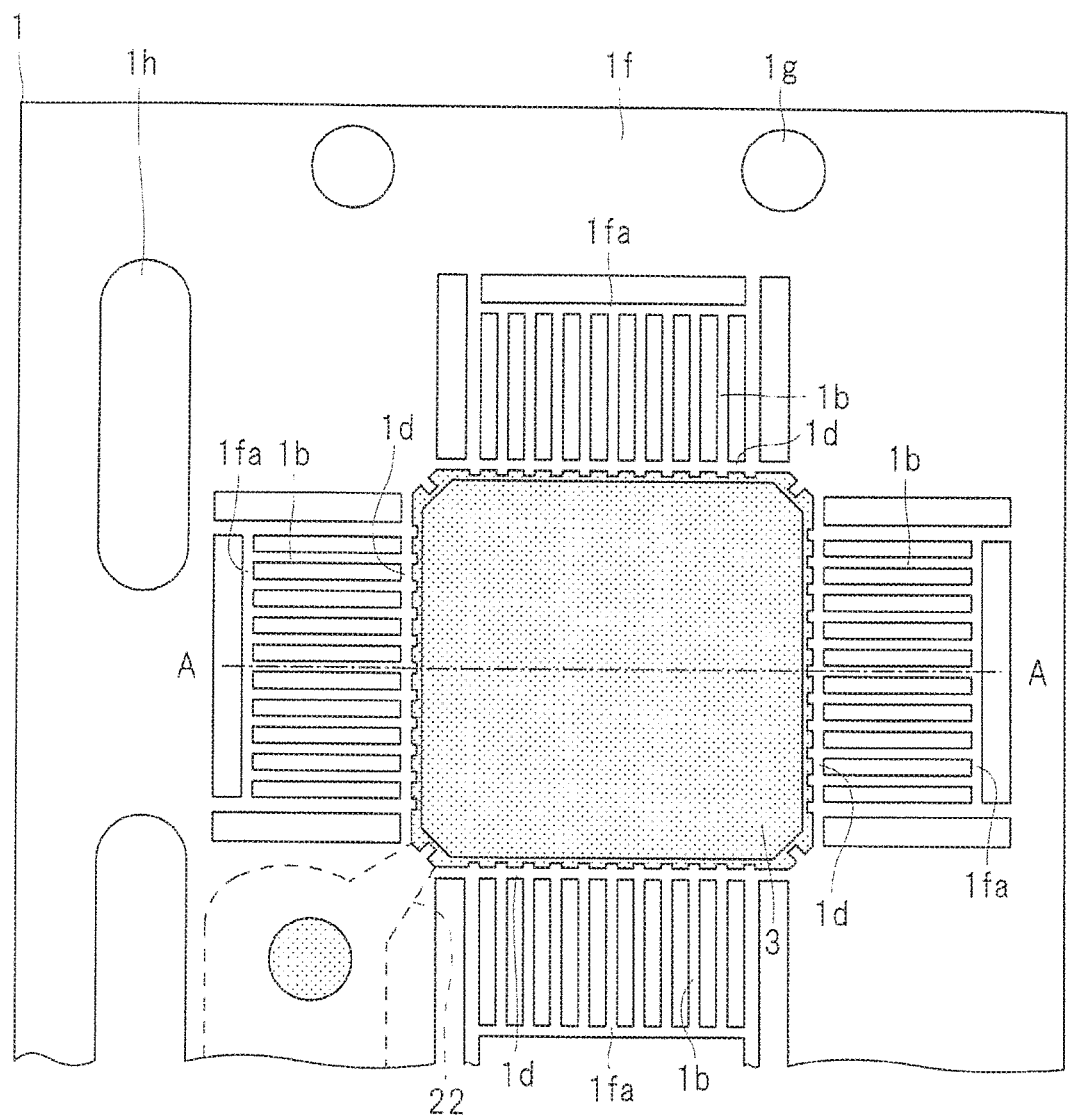
FIG. 21 is a partially enlarged plan view showing one example of a structure after resin molding in the assembling of the semiconductor device of FIG. 1.
Figure 22:
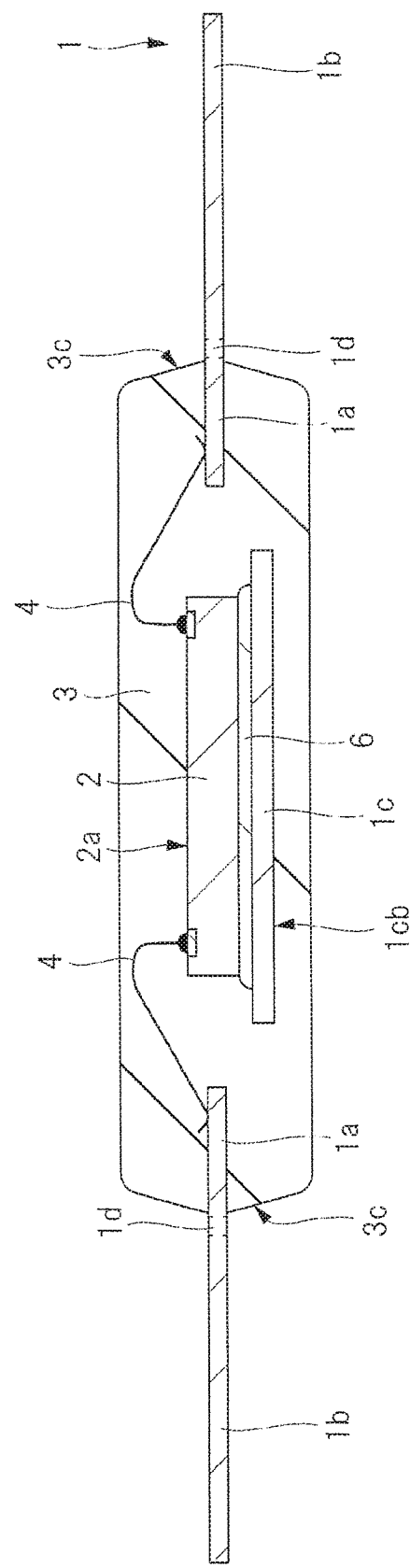
FIG. 22 is a cross-sectional view showing one example of a cross-sectional structure taken along a line A-A of FIG. 21.

Moreover, FIG. 19 is a partially enlarged plan view showing a structure after wire bonding in the assembling of the semiconductor device of FIG. 1, FIG. 20 is a cross-sectional view showing a cross-sectional structure taken along a line A-A of FIG. 19, FIG. 21 is a partially enlarged plan view showing a structure after resin molding in the assembling of the semiconductor device of FIG. 1, and FIG. 22 is a cross-sectional view showing a cross-sectional structure taken along a line A-A of FIG. 21.

Figure 23:
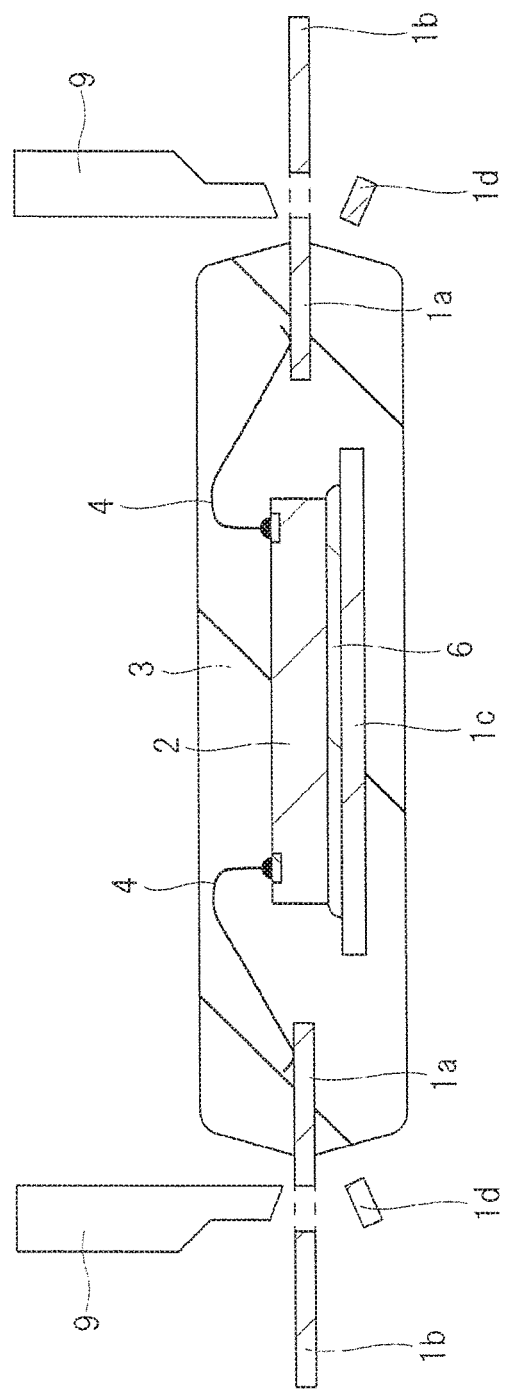
FIG. 23 is a cross-sectional view showing one example of a structure at the time of cutting a dam in the assembling of the semiconductor device of FIG. 1.
Figure 24:
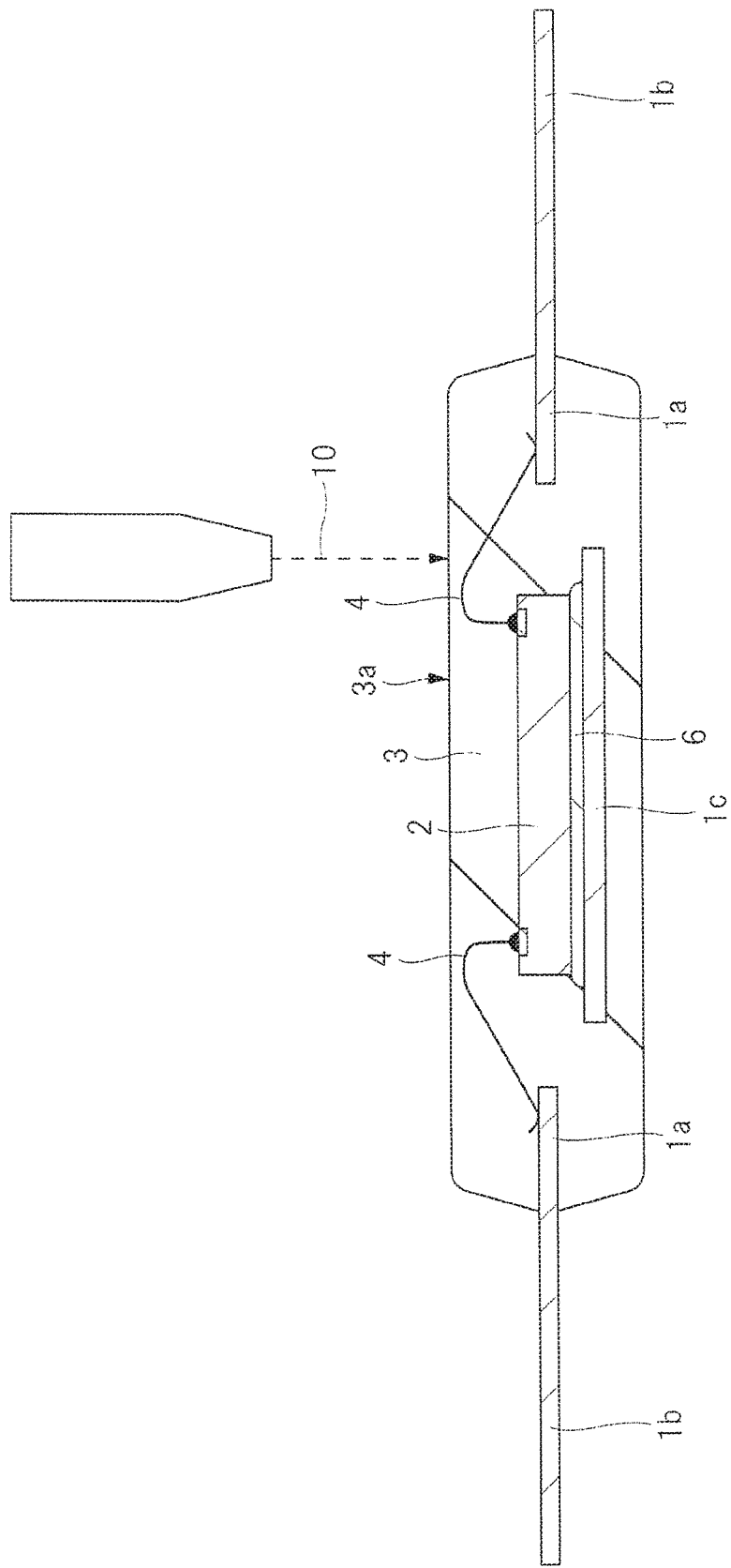
FIG. 24 is a cross-sectional view showing one example of a structure at the time of laser marking in the assembling of the semiconductor device of FIG. 1.
Figure 25:
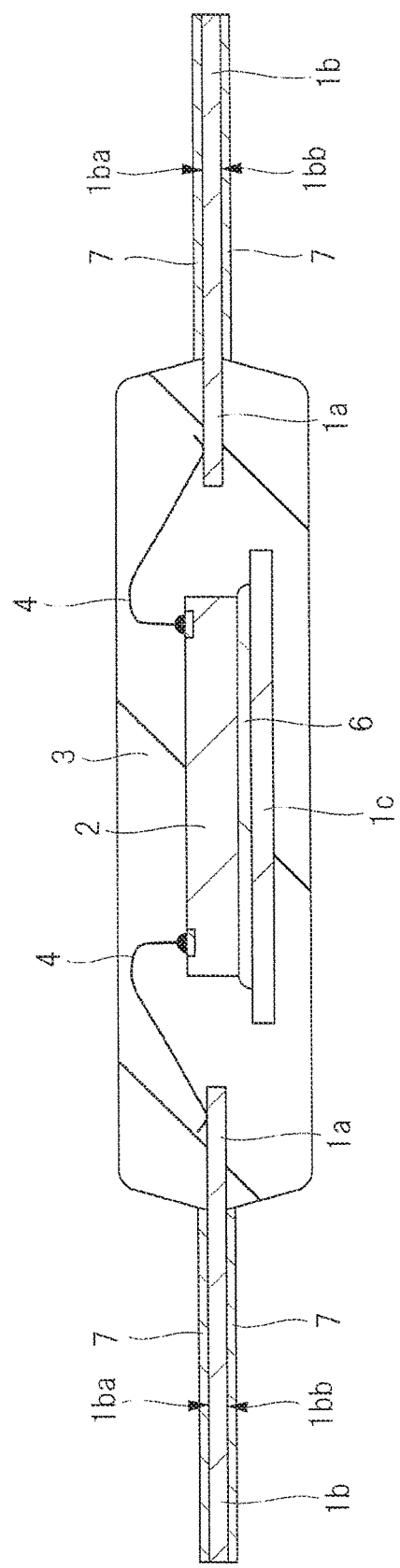
FIG. 25 is a cross-sectional view showing one example of a structure after external plating formation in the assembling of the semiconductor device of FIG. 1.
Figure 26:
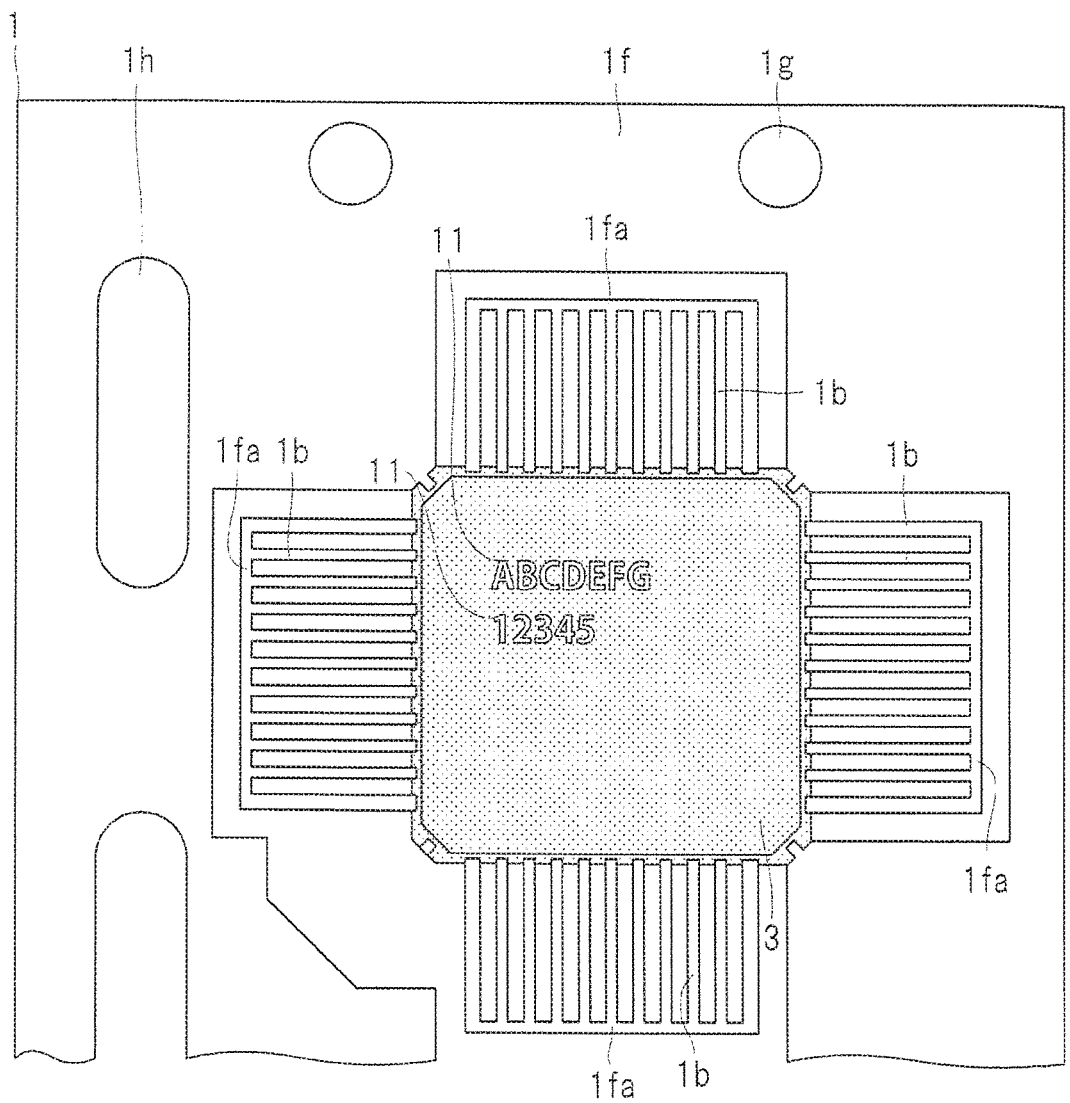
FIG. 26 is a partially enlarged plan view showing one example of a structure after gate-tip cutting in the assembling of the semiconductor device of FIG. 1.

Furthermore, FIG. 23 is a cross-sectional view showing a structure at the time of cutting a dam in the assembling of the semiconductor device of FIG. 1, FIG. 24 is a cross-sectional view showing one example of a structure at the time of laser marking in the assembling of the semiconductor device of FIG. 1, FIG. 25 is a cross-sectional view showing one example of a structure after external plating formation in the assembling of the semiconductor device of FIG. 1, and FIG. 26 is a partially enlarged plan view showing one example of a structure after gate-tip cutting in the assembling of the semiconductor device of FIG. 1.

Figure 27:
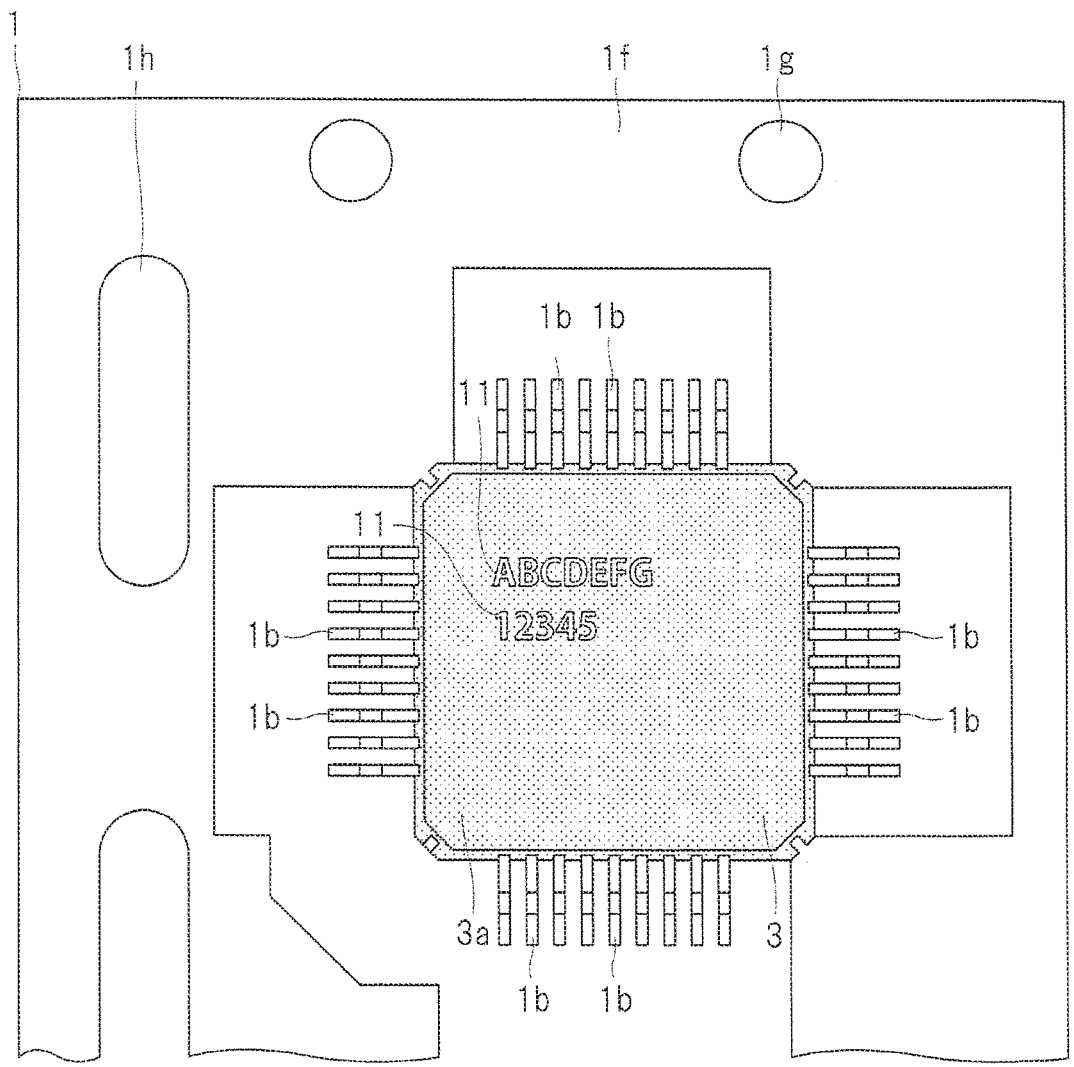
FIG. 27 is a partially enlarged plan view showing one example of a structure after lead cutting and shaping in the assembling of the semiconductor device of FIG. 1.
Figure 28:
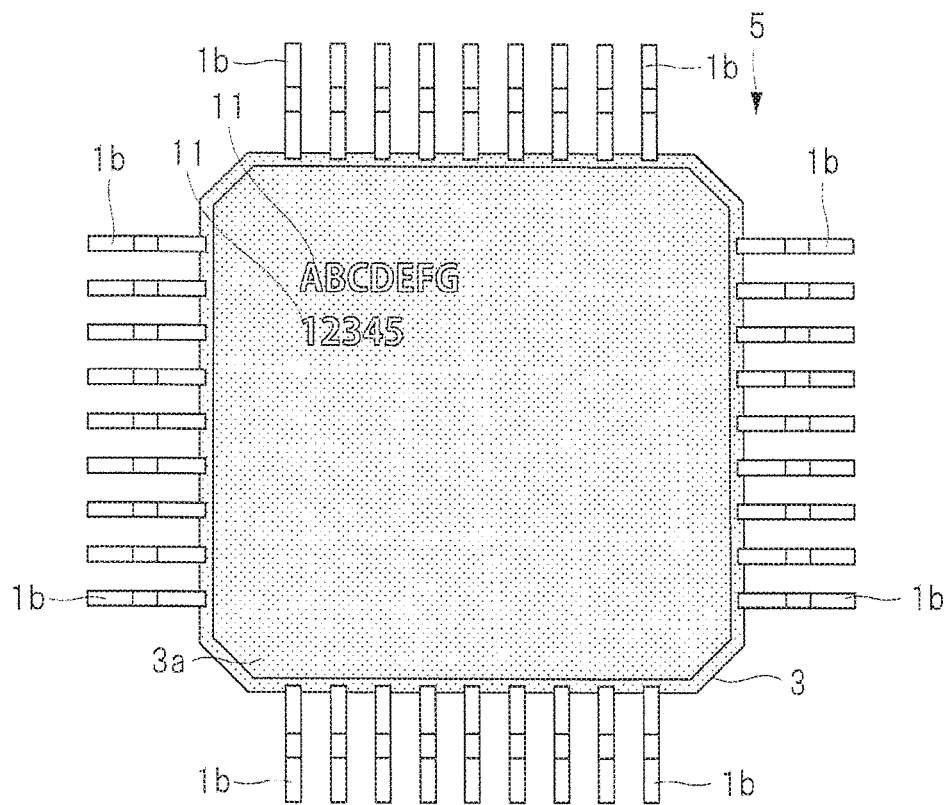
FIG. 28 is a plan view showing one example of a structure after corner portion cutting in the assembling of the semiconductor device of FIG. 1.
Figure 29:
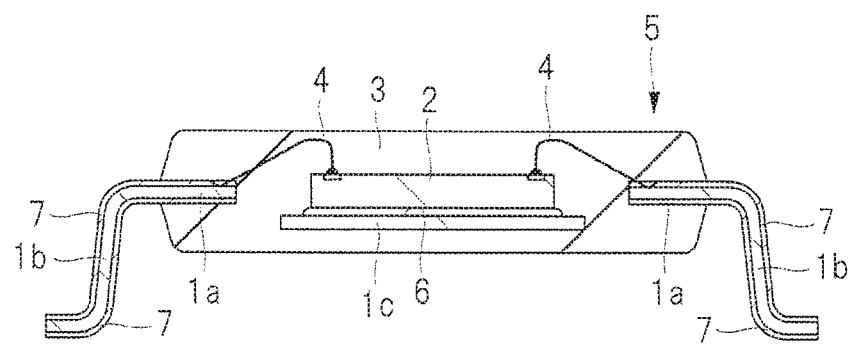
FIG. 29 is a cross-sectional view showing the structure of FIG. 28.
Figure 30:
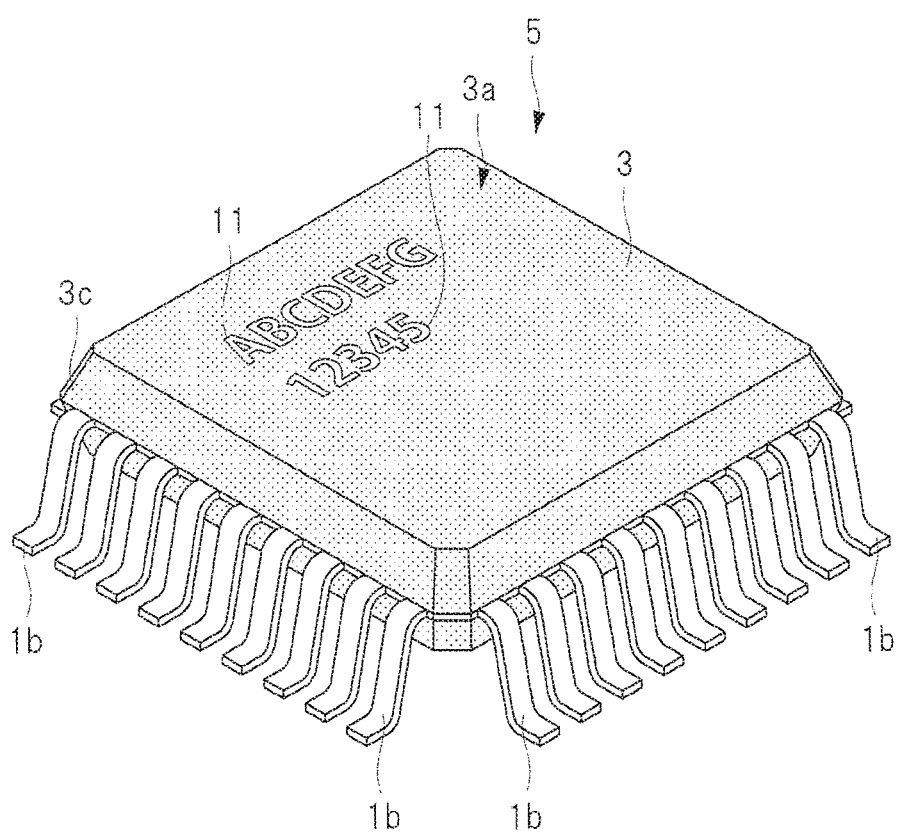
FIG. 30 is an external perspective view of the structure of FIG. 28.

Also, FIG. 27 is a partially enlarged plan view showing one example of a structure after lead cutting and shaping in the assembling of the semiconductor device of FIG. 1, FIG. 28 is a plan view showing one example of a structure after corner portion cutting in the assembling of the semiconductor device of FIG. 1, FIG. 29 is a cross-sectional view showing the structure of FIG. 28, and FIG. 30 is an external perspective view of the structure of FIG. 28.

1. Preparation of Lead Frame

In the assembling of the semiconductor device of the present embodiment, a thin plate-shaped lead frame 1 in which a plurality 6 of device regions (device formation portions) 1i are formed inside a frame portion 1f as shown in FIG. 14 is prepared. Note that the device region 1i is a region in which one QFP 5 is formed. Moreover, in the present embodiment, the plurality of device regions 1i are disposed in a matrix pattern when seen in a plan view, but these may be disposed in one row (single row) and the number of the device regions 1i to be formed on one lead frame 1 is not particularly limited. Moreover, in the present embodiment, the planar shape of the lead frame is a rectangular shape. Also, along a pair of sides (long sides) mutually opposed to each other of the frame portions 1f of the lead frame 1, a plurality of holes 1g for use in positioning, guiding or the like are formed. Furthermore, between the mutually adjacent device regions of the plurality of device regions 1i, a plurality of elongated holes 1h are formed along a pair of sides (short sides) mutually opposed to each other.

Next, the device region 1i will be described in detail.

As shown in FIG. 15, one die pad 1c is formed in one device region 1i. In this case, the planar shape of the die pad in the present embodiment is a substantially square shape. Moreover, the four corners of the die pad 1c are supported by suspension leads 1e. Furthermore, a plurality of leads are formed around the die pad 1c. Each lead is made up of an inner part 1a and an outer part 1b connected thereto. Also, an end portion of each outer part 1b is connected with an inner frame 1fa formed on the inside (die pad side) of the frame portion 1f.

Moreover, in the plurality of outer parts 1b, the mutually adjacent outer parts are coupled to each other by a dam bar 1d at a position slightly outside the border portion between the inner part 1a and the outer part 1b.

Furthermore, each of the plurality of outer parts 1b is formed into an elongated shape such that the stand-off amount of the lead formed in the subsequent lead shaping process becomes large.

Also, as shown in FIG. 16, the die pad 1c supported by the suspension leads 1e is disposed at a position lower than the plurality of inner parts 1a. More specifically, a bent portion is formed in the middle of each suspension lead 1e, whereby the die pad 1c is located at a position lower than the plurality of inner parts 1a.

Note that the lead frame 1 is made of, for example, a metal material mainly made of copper.

In the present embodiment, for the sake of convenience, one device region 1i is taken as a representative example for the following description of the assembling of the QFP 5.

2. Die Bonding

After completion of the lead frame preparation, die bonding is carried out.

As shown in FIG. 17 and FIG. 18, in the die bonding process, the semiconductor chip 2 is mounted on the upper surface 1ca of the die pad 1c via the die bond material 6. More specifically, the semiconductor chip 2 having a plurality of bonding pads 2c formed on the main surface 2a thereof is mounted on the die pad 1c via the die bond material 6.

3. Wire Bonding

After completion of the die bonding, wire bonding is carried out.

As shown in FIG. 19 and FIG. 20, in the wire bonding process, the plurality of bonding pads 2c of the semiconductor chip 2 and the plurality of inner parts 1a are electrically connected with one another via a plurality of wires 4. At this time, each of the one ends of the plurality of wires 4 is bonded to each of wire joint portions 1ac of the plurality of inner parts 1a.

4. Mold

After completion of the wire bonding, molding is carried out.

As shown in FIG. 21 and FIG. 22, in the molding process, the semiconductor chip 2, the die pad 1c, the plurality of inner parts 1a and the plurality of wires 4 are sealed by using sealing resin. First, the lead frame 1 that has been subjected to the wire bonding is disposed in a cavity of a resin molding die (not shown) and the lead frame 1 is clamped by the molding die, and then the sealing resin is injected into the cavity, thereby forming the sealing body 3. The above-mentioned sealing resin is, for example, thermosetting epoxy resin, and the sealing body 3 is formed by a thermosetting process after the injection process.

Note that, since the sealing resin is injected from one of the four corner portions of the sealing body 3 to be formed, a gate resin 22 shown in FIG. 21 is formed at one of the corner portions of the sealing body 3 seen in a plan view. When the sealing body 3 has been formed, the structure shown in FIG. 22 in which a plurality of outer parts 1b protrude from the respective side surfaces 3c of the sealing body 3 is formed.

5. Lead Cutting (Dam Bar Cutting)

After completion of the molding, lead cutting (dam bar cutting) is carried out.

As shown in FIG. 23, in the dam bar cutting process, a dam bar 1d disposed between the adjacent outer parts is cut by a cutting blade 9. Note that, in the dam bar cutting process, only the cutting of the dam bar 1d is carried out.

6. Mark

After completion of the dam bar cutting, marking is carried out.

In the marking process, as shown in FIG. 24, the upper surface 3a of the sealing body 3 is irradiated with a laser 10, and marks 11 such as a predetermined production number, a management number and the like are applied on the upper surface 3a of the sealing body 3 as shown in FIG. 26 to be described later.

7. Plating

After completion of the marking process, plating film formation is carried out.

In the plating process, as shown in FIG. 25, a plating film (external plating) 7 such as solder plating or the like is formed on the respective surfaces (surfaces including the upper surface 1ba and the lower surface 1bb) of the plurality of outer parts 1b.

When solder plating is used as the plating film 7, it is preferable to adopt lead-free solder, and by adopting the lead-free solder, it is possible to reduce the environmental load. The lead-free solder mentioned here refers to the solder having a content of lead (Pb) of 0.1 wt % or less, and this content is determined based on a standard of RoHS (Restriction of Hazardous Substance) directive.

8. Lead Cutting (Gate Cutting)

After completion of the plating process, lead cutting (gate cutting) is carried out.

In the gate cutting process, a frame at the corner where the gate resin 22 shown in FIG. 21 is formed is cut. Thus, the sealing body 3 is brought into a state of being supported on the lead frame 1 by the remaining three corner portions.

9. Lead Shaping

After completion of the gate cutting process, lead shaping is carried out.

In the lead shaping process, first, the inner frame 1fa that connects tip ends of the respective outer parts 1b with each other is cut off from the frame portion 1f (see FIG. 26). Next, while keeping the tip ends of the respective outer parts 1b connected with each other, the outer parts 1b are shaped (bent) into, for example, a gull-wing shape as shown in FIG. 29. Thereafter, the inner frame 1fa that connects the tip ends of the respective outer parts 1b with each other is cut, thereby separating the respective outer parts 1b from each other (see FIG. 27).

Note that this shaping process of the outer parts 1b is carried out, while keeping the plurality of suspension leads 1e connected with the frame portion 1f.

10. Lead Cutting (Corner Portion Cutting)

After completion of the lead shaping process, lead cutting (corner portion cutting) is carried out.

In the corner portion cutting process, at the remaining three corner portions supporting the sealing body 3 shown in FIG. 27, the frame is cut for singulation. In this manner, as shown in FIG. 28 to FIG. 30, the assembling of the QFP 5 in which each of the outer parts 1b has a large stand-off amount is completed.

<Mounting Method of Semiconductor Device>

In the mounting process of the QFP 5 of the present embodiment, the QFP 5 is mounted on the motherboard 12 serving as the mounting board via the solder 8 as shown in FIG. 12. At this time, since the stand-off amount of each of the outer parts 1b is large in the QFP 5, the wet-up amount of the solder 8 is increased in each of the outer parts 1b, so that the solder 8 wets up to a high position (to the bending portion 1bc shown in FIG. 3) in the height direction of each of the outer parts 1b.

Therefore, the bonding strength in the solder bonding of each of the outer parts 1b of the QFP 5 is enhanced. As a result, it is possible to ensure high mounting reliability (mounting strength) in the QFP 5.

Note that the QFP 5 is a semiconductor device having a high occupancy ratio of the semiconductor chip 2 inside the sealing body 3, and even in the case of the QFP 5 having such a high occupancy ratio of the semiconductor chip 2, it is possible to enhance the mounting reliability and consequently to reduce the joint failure to the motherboard 12.

Moreover, even in the case of the QFPs 13b and 13c and the like that are mounted under a severe environment with a high degree of influence of heat from the ECU board (motherboard 12) as shown in FIG. 4, it becomes possible to enhance the mounting reliability of these devices and consequently to reduce the joint failure to the ECU board (however, the structure having a large stand-off amount may be applied also to other semiconductor devices on the motherboard 12).

MODIFIED EXAMPLE

In the foregoing, the invention made by the inventor of the present invention has been concretely described based on the embodiment. However, it is needless to say that the present invention is not limited to the foregoing embodiments and various modifications and alterations can be made within the scope of the present invention.

Modified Example 1

In the description of the embodiment above, the case in which the QFP has a die-pad embedded structure is taken as an example, but the QFP may have a so-called tab exposed structure in which a part (for example, lower surface 1cb) of the die pad 1c is exposed from the sealing body 3.

Modified Example 2

In the above-mentioned embodiment, the case in which the semiconductor device is the QFP has been described, but the semiconductor device may be a semiconductor device of a so-called SOP (Small Outline Package) type in which a plurality of leads serving as external connection terminals protrude from two mutually opposed sides of the sealing body 3 having a substantially square shape in its planar shape.

Modified Example 3

With respect to the QFP 5 of the above-mentioned embodiment, the fact that the linear expansion coefficient of the sealing body 3 is lowered when the occupancy ratio of the semiconductor chip 2 inside the sealing body in the thickness direction of the sealing body 3 is increased has been described, but the thickness of the sealing body 3 above the chip may be adopted as the comparison target for the thickness of the semiconductor chip 2. More specifically, the occupancy ratio of the semiconductor chip 2 corresponds to the ratio (dominating amount) of the thickness of the semiconductor chip 2 relative to the total thickness of the sealing body 3 in the thickness direction of the sealing body 3. Therefore, even when the thickness of the sealing body 3 below the die pad is larger than the thickness of the semiconductor chip 2, if the thickness of the sealing body 3 above the chip is smaller than the thickness of the semiconductor chip 2, the linear expansion coefficient of the sealing body 3 is lowered, with the result that a mounting failure of the semiconductor device might occur due to the deformation (expansion, contraction) of the sealing body 3. For this reason, the comparison target for the chip thickness is not limited to the thickness of the sealing body 3 below the die pad, and the thickness of the sealing body 3 above the chip may be adopted thereto. However, when the semiconductor chip 2 and the leads are electrically connected with each other via the wires 4 like the case of the QFP 5 of the above-mentioned embodiment, the thickness of the sealing body 3 formed above (on the main surface side) of the semiconductor chip 2 is larger than the thickness of the semiconductor chip 2 in most cases so as to prevent the wires 4 from being exposed to the surface of the sealing body 3. Therefore, when determining the occupancy ratio (dominating amount) of the semiconductor chip 2 in the sealing body 3, the thickness of the sealing body 3 below the die pad is preferably adopted as the comparison target.

Modified Example 4

In the above-mentioned embodiment, the case where each of the plurality of outer parts 1b in the semiconductor device (QFP 5) is formed into a gull-wing shape has been described. However, each of the plurality of outer parts 1b may have a J-lead shape. More specifically, the semiconductor device may be a QFJ (Quad Flat J-leaded Package) or an SOJ (Small Outline J-leaded Package).

Modified Example 5

In the assembling of the semiconductor device of the above-mentioned embodiment, the case where the sealing body 3 is formed in a molding process, and after the formation of the sealing body, a plating film (external plating) 7 is formed on the surface of each of the outer parts 1b has been described. However, it is also possible to prepare a lead frame 1 having a plating film mainly made of, for example, palladium (Pd) preliminarily formed on the whole surface thereof, and assemble the semiconductor device by using this lead frame 1.

According to this assembling, the external plating application process after the molding process can be omitted.

Modified Example 6

In the above-mentioned embodiment, the case where the plating film 7 formed on each of the outer parts 1b in the external plating process is a plating film made of a solder material, and the solder material is a lead-free solder substantially containing no lead (Pb) has been described, but the solder material may be a material containing lead. However, when taken into account an environmental contamination problem, the use of a solder material made of lead-free solder is more preferable.

Modified Example 7

Moreover, the modified examples may be applied in combination with one another within a scope without departing from the gist of technical ideas described in the embodiments above.

What is claimed is:
1. A semiconductor device comprising:
a die pad including a first surface and a second surface opposite to the first surface;
a semiconductor chip including a main surface, a plurality of bonding electrodes formed on the main surface and a back surface opposite to the main surface, and mounted on the first surface of the die pad via a die bond material such that the back surface faces the first surface of the die pad, the semiconductor chip essentially comprising a first material having a first linear expansion coefficient;
a plurality of leads electrically connected with the plurality of bonding electrodes via a plurality of wires, respectively; and
a sealing body including an upper surface located on the same side as the main surface of the semiconductor chip, a lower surface opposite to the upper surface, a first side surface located between the upper surface and the lower surface, and a second side surface located between the upper surface and the lower surface and also opposite to the first side surface, and sealing the semiconductor chip and the plurality of wires, the sealing body essentially comprising a second material having a second linear expansion coefficient, the second linear expansion coefficient being higher than the first linear expansion coefficient, wherein each of the plurality of leads has an inner part sealed with the sealing body, and an outer part exposed from the sealing body, wherein the outer part has:
    a first part connected to the inner part and extending in a horizontal direction, which is along the upper surface of the sealing body,
    a second part connected to the first part via a first bending portion that bends the outer part in a thickness direction, which is from the upper surface toward the lower surface, of the sealing body, and
    a third part connected to the second part via a second bending portion that bends the outer part in the horizontal direction, wherein the plurality of leads has:
    a first lead electrically connected with a first bonding electrode of the plurality of bonding electrodes via a first wire of the plurality of wires and protruding from the first side surface of the sealing body, and
    a second lead electrically connected with a second bonding electrode of the plurality of bonding electrodes via a second wire of the plurality of wires and protruding from the second side surface of the sealing body, wherein, in cross-section view, the semiconductor chip is located between the inner part of the first lead and the inner part of the second lead, wherein, in cross-section view, a thickness of the semiconductor chip is greater than a thickness from the second surface of the die pad to the lower surface of the sealing body, which is greater than a thickness of each of the die pad and the die bond material, wherein, in cross-section view, a stand-off amount of each of the plurality of leads, which is a distance, in the thickness direction of the sealing body, from the lower surface of the sealing body to the third part of the outer part, is greater than a high-stand value of a stand-off amount of QFP (Quad Flat Package) based on JEITA (Japan Electronics and Information Technology Industries Association) and less than a thickness from the upper surface of the sealing body to the lower surface of the sealing body, and wherein, in cross-section view, the stand-off amount of each of the plurality of leads is greater than a thickness from an upper surface of the inner part of each of the plurality of leads, which is located on the same side as the main surface of the semiconductor chip, to the upper surface of the sealing body, or a thickness from a lower surface of the inner part of each of the plurality of leads, which is located on the same side as the second surface of the die pad, to the lower surface of the sealing body.

2. The semiconductor device according to claim 1,
wherein the first material is silicon, and
wherein the second material is epoxy resin.

3. The semiconductor device according to claim 1, wherein the thickness of the sealing body is one of 1.40 mm and 1.00 mm.

4. The semiconductor device according to claim 3, wherein the stand-off amount of each of the plurality of leads is 0.73 mm.

5. The semiconductor device according to claim 3, wherein a thickness of each of the plurality of leads is 0.125 mm or 0.15 mm.

6. The semiconductor device according to claim 5, wherein, in plan view, the plurality of leads is arranged around the semiconductor chip.

* * * * *